(12) United States Patent
Nakahara et al.

(10) Patent No.: US 6,512,709 B1
(45) Date of Patent: *Jan. 28, 2003

(54) SEMICONDUCTOR INTEGRATED CIRCUIT

(75) Inventors: Shigeru Nakahara, Ome (JP); Hideki Hayashi, Ome (JP); Takeshi Suzuki, Tachikawa (JP); Keiichi Higeta, Hamura (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/173,429

(22) Filed: Jun. 18, 2002

Related U.S. Application Data

(63) Continuation of application No. 09/886,026, filed on Jun. 22, 2001, now Pat. No. 6,445,627.

(30) Foreign Application Priority Data

Jul. 11, 2000 (JP) ........................................ 2000-209946

(51) Int. Cl.[7] ................................................. G11C 7/00
(52) U.S. Cl. ........................ 365/200; 365/201; 365/219
(58) Field of Search ................................. 365/200, 201, 365/219, 189.12

(56) References Cited

U.S. PATENT DOCUMENTS

| | | | |
|---|---|---|---|
| 5,396,499 A | * 3/1995 | Urai | 365/200 |
| 5,912,851 A | 6/1999 | Matsuoka | 365/201 |
| 5,995,424 A | * 11/1999 | Lawrence et al. | 365/201 |
| 6,119,251 A | * 9/2000 | Cloud et al. | 365/201 |
| 6,175,530 B1 | * 1/2001 | Theron et al. | 365/201 |
| 6,327,198 B1 | 12/2001 | Kato et al. | 365/201 |

* cited by examiner

*Primary Examiner*—Huan Hoang
(74) *Attorney, Agent, or Firm*—Miles & Stockbridge P.C.

(57) ABSTRACT

A semiconductor integrated circuit having therein a plurality of memories, realizing an improved yield by efficiently repairing a defective bit in a memory. This semiconductor integrated circuit has: a plurality of circuit blocks (RAM macro cells) each having an identification code coincidence detecting circuit for determining whether an input identification code coincides with a self identification code or not and a reception data latch and performing an operation according to latched data; a setting circuit capable of setting the identification code and information corresponding to the identification code and serially outputting the set information; and a control circuit capable of sequentially reading the setting information from the setting circuit, converting the setting information to parallel data, and transferring the parallel data to the plurality of circuit blocks. Each of the plurality of circuit blocks captures and holds the setting information transferred when the identification code coincidence detecting circuit determines that the input identification code and the self identification code coincide with each other.

6 Claims, 21 Drawing Sheets

VDLY1

READING OPERATION

WRITING OPERATION

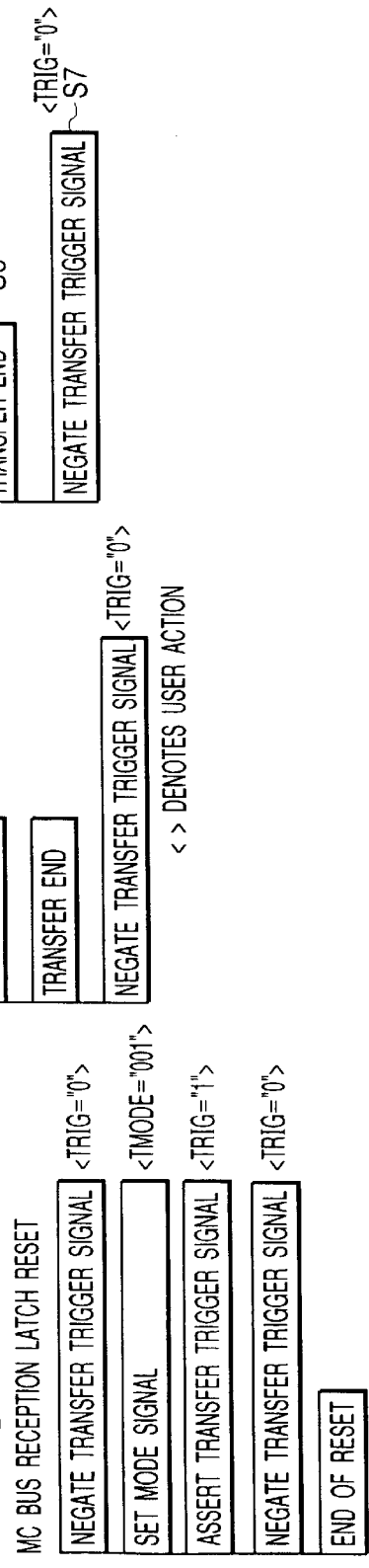
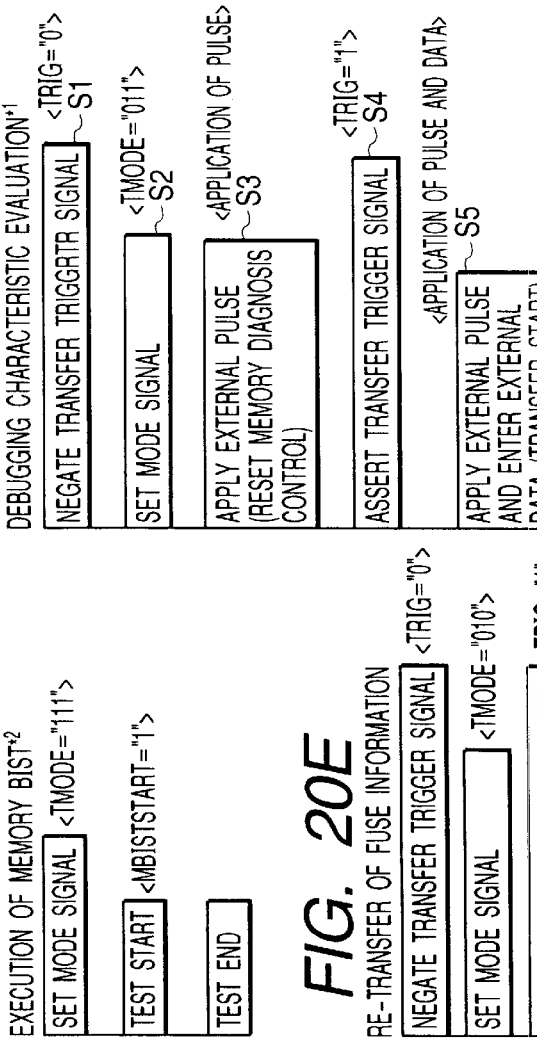
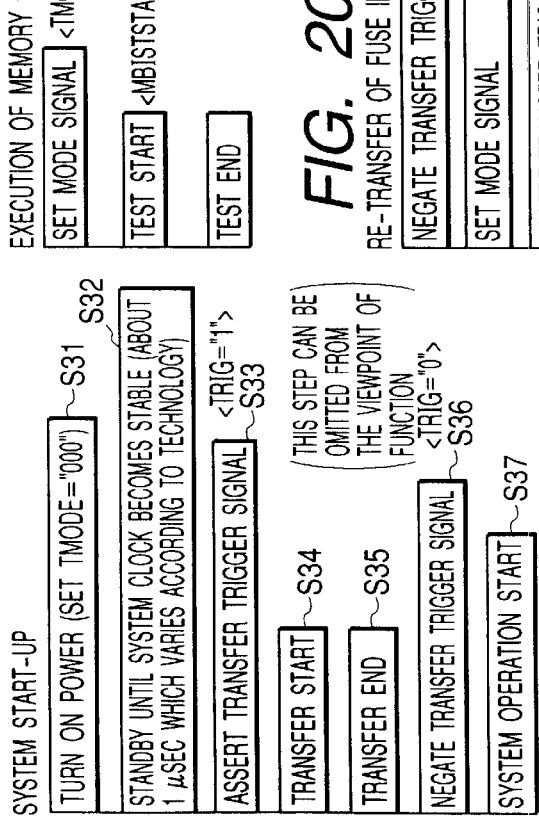

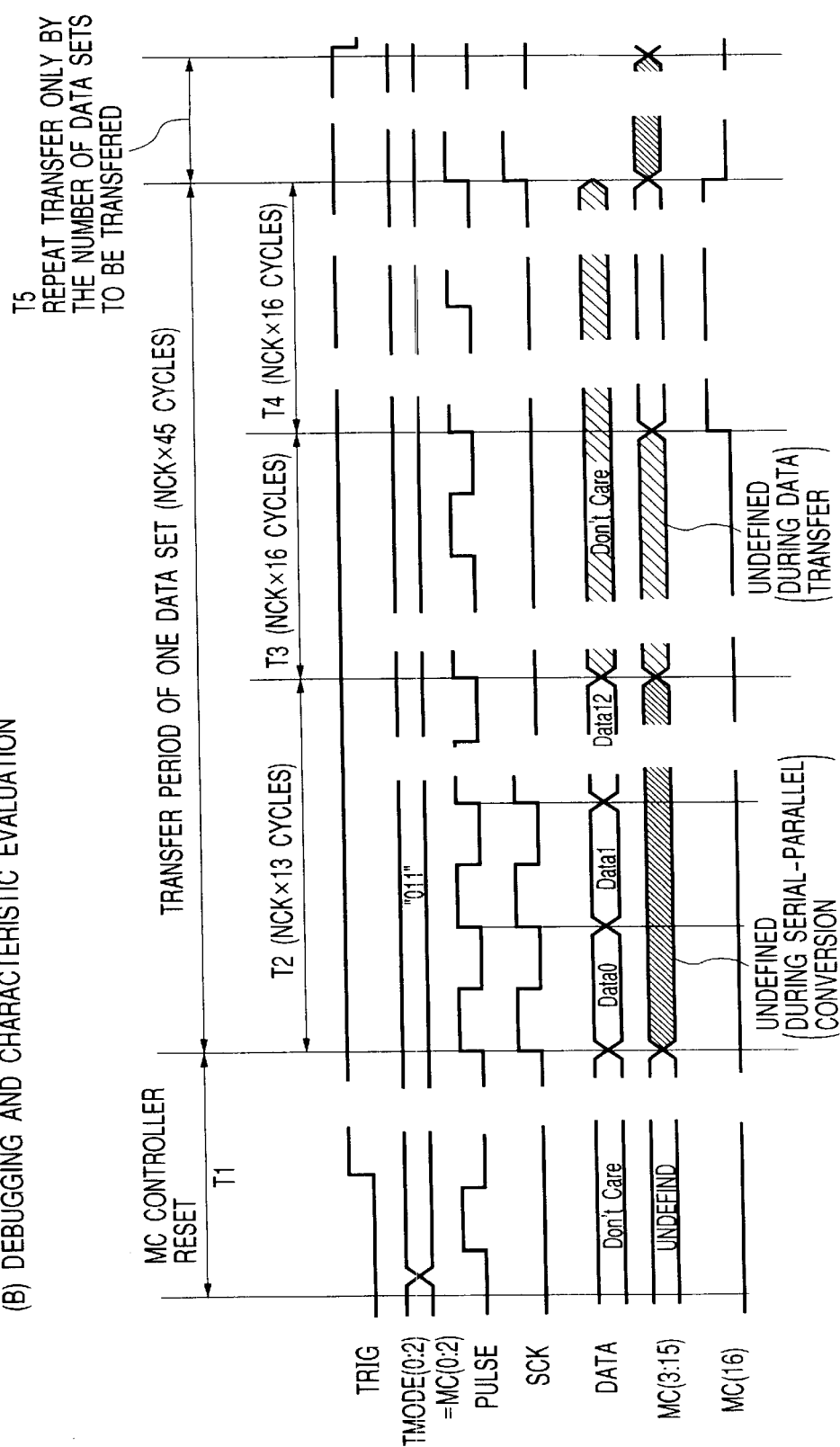

SEMICONDUCTOR INTEGRATED CIRCUIT

CROSS-REFERENCE TO RELATED APPLICATION

This application is a continuation of application Ser. No. 09/886,026 filed Jun. 22, 2001 now U.S. Pat. No. 6,445,627.

TECHNICAL FIELD OF THE INVENTION

The present invention relates to a semiconductor integrated circuit technique and further a technique of making setting in each circuit block changeable. For example, the invention relates to a technique effective for application to a method of repairing a defective bit in a memory, adjustment of an operation timing of a memory, and a diagnosis test on the memory in a semiconductor integrated circuit having therein a plurality of memories.

BACKGROUND OF THE INVENTION

Conventionally, in a semiconductor integrated circuit having therein a semiconductor memory such as a RAM (Random Access Memory) or a memory, to improve the yield by repairing a defective bit included in the memory, a redundancy circuit including an address setting circuit for storing a spare memory column, a spare memory row, and a defective address is provided. A defective address is set in the redundancy circuit generally by a method using a fuse which can be programmed by a laser or the like. Examples of known techniques are Japanese Unexamined Patent Publication Nos. 274096/1992 (corresponding to U.S. Pat. No. 5,430,679) and 275494/1998 (corresponding to U.S. Pat. No. 5,859,801).

As the packing density of a semiconductor integrated circuit increases in recent years, an LSI having therein a plurality of memories on a single semiconductor chip is seen more often. For example, in some cases, in a processor for a computer, to provide various RAMs for a primary cache of a large capacity, a secondary cache, TLB, tag cache, memory for branch prediction, and write buffer, nearly 100 built-in RAMs are provided.

SUMMARY OF THE INVENTION

In the case of providing an LSI having therein a number of RAMs (memories) as described above with a redundancy circuit including an address setting circuit for storing a defective address for each built-in RAM, for example, when the number of built-in RAMs is 100 and a repair address consists of 10 bits, about 1,000 fuses are necessary. Consequently, a problem such that the chip size increases due to the redundancy circuit occurs.

The present inventors have found the following. In an LSI having therein about 100 RAMs each having a storage capacity of 1 Mbit or less, the probability that defective bits which can be repaired occur in all the 100 built-in RAMs is very low. Defective bits which can be repaired occur in a few to tens of built-in RAMs in many cases. Even if the redundancy circuits are provided for all the built-in RAMs, the yield cannot be improved so efficiently by the arrangement. It is also important to rationally diagnose a number of RAMs.

An object of the invention is to provide a semiconductor integrated circuit technique capable of improving the yield by efficiently repairing a defective bit in a memory circuit in a semiconductor integrated circuit having therein a plurality of memory circuits such as RAMs.

Another object of the invention is to provide a semiconductor integrated circuit having therein a plurality of memory circuits, with an increased operation margin by adjusting a timing of accessing a memory circuit, capable of accessing a memory circuit at higher speed.

Further another object of the invention is to provide a semiconductor integrated circuit having a general bus method commonly used for diagnosing memories and setting memory characteristics.

The above and other objects and novel features of the invention will become apparent from the description of the specification and the appended drawings.

The outline of representative ones of inventions disclosed in the application will be described as follows.

A semiconductor integrated circuit according to the invention comprises: a plurality of circuit blocks each having an identification code coincidence detecting circuit for determining whether an input identification code matches with a self identification code or not and a reception data latch or holding circuit and performing an operation according to data latched; a setting circuit capable of setting the identification code and information corresponding to the identification code and serially outputting the set information; and a control circuit capable of sequentially reading the setting information from the setting circuit, converting the read setting information to parallel data, and transferring the parallel data to the plurality of circuit blocks. Each of the plurality of circuit blocks captures and holds the transferred setting information by the corresponding reception data latch when the identification code coincidence detecting circuit determines that the input identification code and the self identification code match with each other.

According to the means, the setting of repair address information, timing information, or the like can be changed in each of the circuit blocks in the semiconductor integrated circuit after the manufacture of the semiconductor integrated circuit, thereby enabling the performance of each circuit block to be maximally drawn out. Further, the setting circuit for setting information to be held by the plurality of circuit blocks can be shared by the plurality of circuit blocks, so that the scale of the setting circuit can be largely reduced. Since the setting information of the setting circuit is read as serial data by using the serial bus, an information amount which can be set in the setting circuit can be increased without changing the control circuit. Further, it is sufficient to transfer the setting information of the setting circuit to each of the circuit blocks once at the time of, for example, start-up of the system. Consequently, the throughput does not deteriorate due to the serial transfer method.

Desirably, the setting information is transferred from the control circuit to the plurality of circuit blocks via a parallel bus. With the configuration, a plurality of signal lines in the parallel bus for transferring the setting information from the setting circuit to the plurality of circuit blocks can be commonly used. As compared with the case where a signal line dedicated to transfer the setting information to each of the circuit blocks is provided, the number of signal lines can be largely reduced.

The setting circuit has a plurality of program elements or program devices which can be programmed from the outside and a shift register for reading states of the program devices in parallel and serially transferring the read states. With the configuration, arbitrary information can be set after manufacture of the semiconductor integrated circuit, and information set in the setting circuit can be efficiently read.

Further, the shift register performs a shifting operation in accordance with a clock signal for shifting supplied from the control circuit. Consequently, the setting information can be automatically transferred without externally generating a clock signal for shifting and supplying the signal.

Preferably, a plurality of terminals to which information can be input from the outside of the semiconductor integrated circuit are provided, and the control circuit can transfer either information input from the plurality of terminals or information set in the setting circuit to the plurality of circuit blocks by using the parallel bus. With the configuration, before information is set in the setting information, the setting information is held by each of the circuit blocks and a test operation is performed to preliminarily check whether the setting information is appropriate or not. Thus, erroneous setting can be avoided. Since the parallel bus is commonly used, the circuit scale can be prevented from being enlarged.

When each of the plurality of circuit blocks is a memory circuit having a redundancy circuit for replacing a memory cell having a defect with a spare memory cell, the reception data latch captures and holds a repair address which makes the redundancy circuit valid. When a single semiconductor integrated circuit has therein a plurality of memory circuits and each memory circuit has a redundancy circuit, if a repair address setting circuit including program elements or program devices is provided for each memory circuit, the number of the program devices becomes enormous, and it causes an increase in chip size. According to the means, the circuit for setting the repair address can be shared. Consequently, the number of program elements or program devices as a whole can be reduced, and the chip size can be reduced.

Each of the plurality of circuit blocks has timing adjusting means capable of adjusting a timing of a signal which gives an operation timing of a predetermined circuit, and the reception data latch captures and holds timing information in the timing adjusting means. With the configuration, the operation timing of each circuit block can be optimized and the operation speed of the circuit can be increased. As compared with the case where a circuit for setting timing information is provided for each circuit block, the circuit scale can be largely reduced.

Each of the plurality of circuit blocks is a memory circuit having a redundancy circuit for replacing a memory cell having a defect with a spare memory cell and timing adjusting means capable of adjusting a timing of a signal which gives an operation timing of a predetermined circuit, and the reception data latch captures and holds the repair address or timing information in the timing adjusting means in accordance with a signal supplied from the control circuit, and performs an operation corresponding to the captured information. With the configuration, the circuit for holding the repair address for the redundancy circuit and the circuit for holding the timing information in the timing adjusting means can be commonly used. Consequently, as compared with the case where the circuits are provided for each circuit block, the circuit scale can be reduced.

A test control circuit for operating the plurality of circuit blocks for a test may be provided. The circuit block operates in response to a control signal from the test control circuit and outputs a test operation result. With the configuration, without using an expensive tester, the circuit blocks can be tested, so that the cost can be reduced.

Further, information to be set in the setting circuit is determined on the basis of a test result of the plurality of circuit blocks by the test control circuit and the information is set in the setting circuit. In such a manner, without using an expensive tester, the circuit blocks can be tested, so that the cost can be reduced. The information can be easily set in the setting circuit on the basis of the test result. Thus, time required for the test and setting of the information to the setting circuit can be largely shortened.

BRIEF DESCRIPTION OF THE DRAWINGS

FIGS. 20A–20B are an operation sequence of the LSI in the embodiment.

FIG. 21 is a transfer timing chart of a memory control bus.

PREFERRED EMBODIMENTS

Preferred embodiments of a semiconductor integrated circuit of the invention will be described hereinbelow with reference to the drawings.

Figure 1:
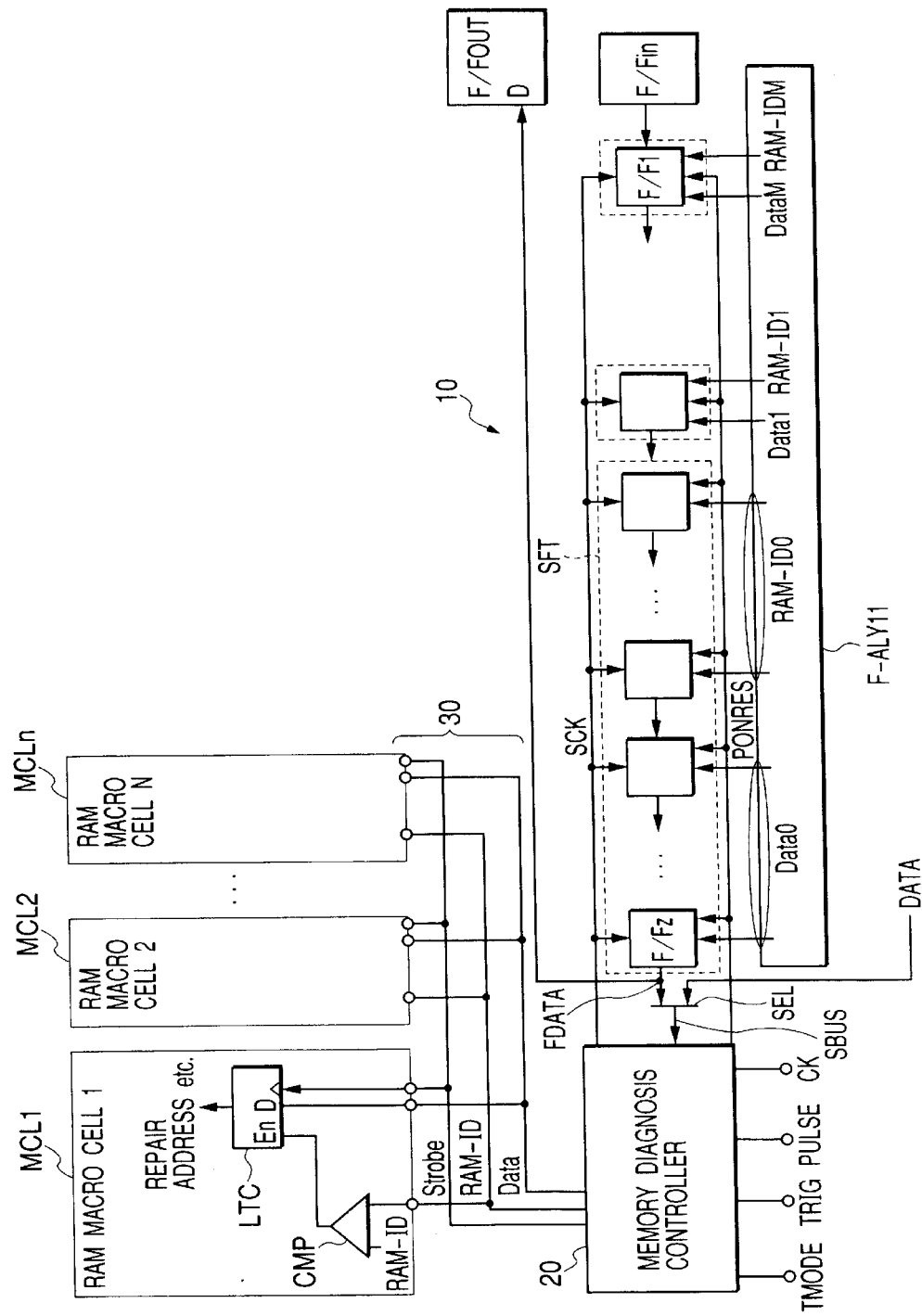
FIG. 1 is a block diagram showing an outline of the invention.

In the semiconductor integrated circuit of the invention, as FIG. 1 shows an outline of the circuit, identification codes (ID codes) are preliminarily given to a plurality of memory blocks MCL1, MCL2, . . . MCLn provided in a chip. A comparator CMP for comparing the ID code with an input ID code (RAM-ID) and a latch circuit or holding circuit LTC for latching information (data) such as an input address when the ID codes coincide with each other are provided. In positions separate from the memory blocks, a setting circuit 10 for setting pairs of repair addresses (Data0 to DataM) for the plurality of memory blocks MCL1, MCL2, . . . MCLn and ID codes (RAM-ID0 to RAM-IDM) for specifying a memory block to be repaired and a memory diagnosis controller 20 as a control circuit for controlling the setting circuit 10 are provided. The setting circuit 10 comprises a fuse array F-ALY11 in which fuses as program elements or program devices which can be programmed from the outside are arranged and a shift register SFT for reading states of the fuses and transferring the states in series. By the memory diagnosis controller 20, set information is serially read from the setting circuit 10 via a serial bus SBUS and converted to parallel data. The parallel data is supplied via a memory control bus 30 as a parallel bus to the memory blocks MCL1, MCL2, . . . MCLn, and a repair address is allowed to be automatically latched.

Between the setting circuit 10 and the memory diagnosis controller 20, a selector SEL for supplying either data FDATA from the setting circuit 10 or data DATA from an external terminal to the memory diagnosis controller 20 is provided. By the selector SEL, in a case such that a defective bit occurs newly in any of the memory blocks while the system is operating, in place of the data FDATA from the setting circuit 10, the data DATA from the outside is sent to the memory block in which the defective bit occurs so as to be latched. In such a manner, without replacing the chip or additional programming of a fuse, a failure can be repaired.

Further, to detect the presence/absence of a failure in the shift register itself constructing the setting circuit 10, a data output terminal of a flip flop F/Fin for inputting test data is connected to a data terminal of a flip flop F/F1 at the first stage. A data output terminal of a flip flop F/Fz at the final stage of the shift register is connected to a data input terminal of a flip flop F/Fout for outputting test data. With the configuration, for example, "1" or "0" is set in the flip flop F/Fin for inputting test data and shifted along the shift register. By determining whether data finally latched by the flip flop F/Fout for outputting test data coincides with the input data or not, whether there is a failure in the shift register or not can be detected.

By providing the flip flops F/Fin and F/Fout for inputting/outputting test data on a scan path used for, for example, a test on a logic or a boundary-scan test, setting of test data and reading of a test result can be performed without additionally providing a special mechanism. Instead of providing the flip flops F/Fin and F/Fout for inputting/outputting test data, it is also possible to provide an external terminal for inputting/outputting test data, directly input test data, and observe a test result.

Figure 2:
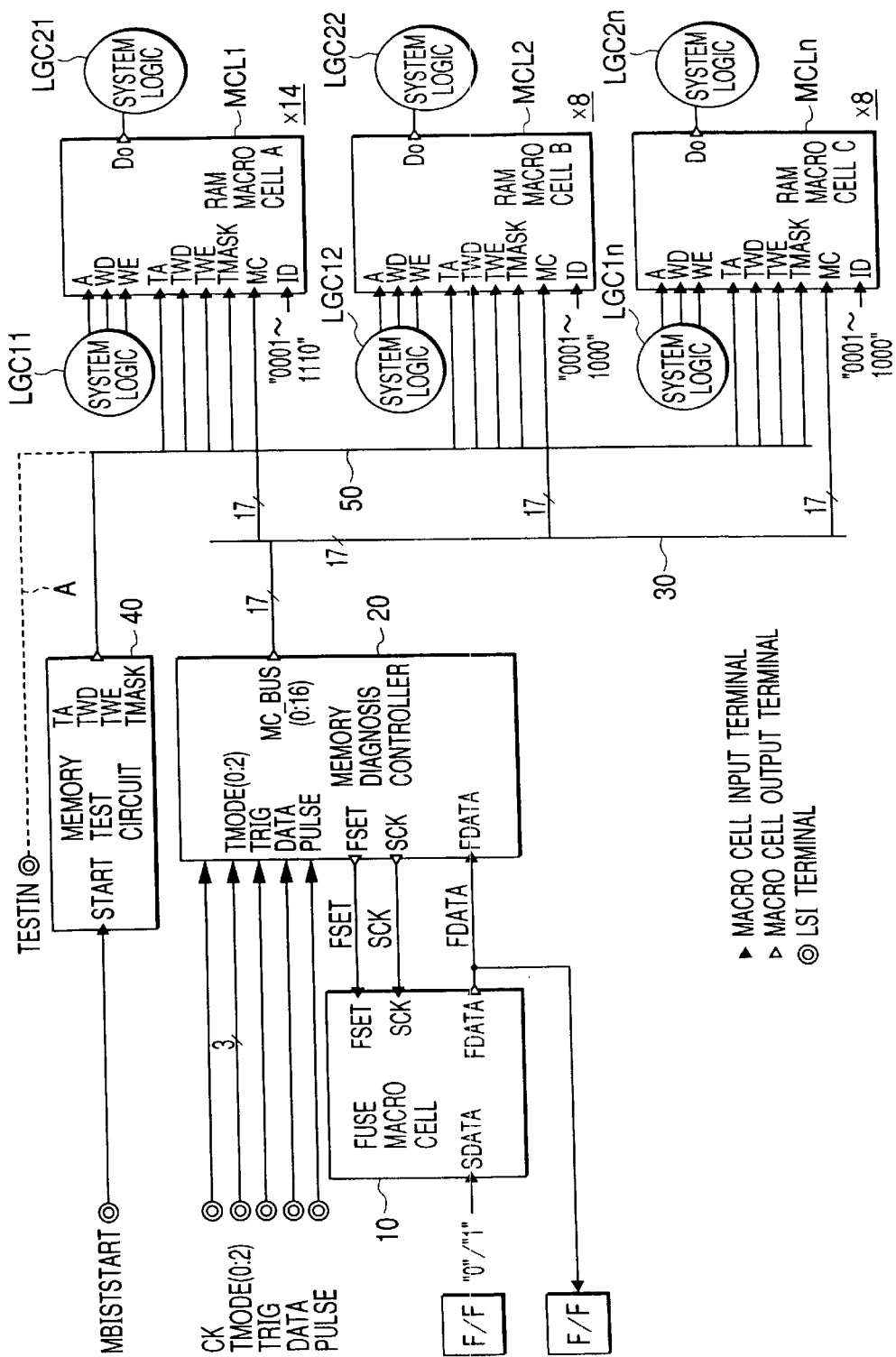
FIG. 2 is a diagram showing a schematic configuration of a semiconductor integrated circuit to which the invention is applied.

FIG. 2 shows a schematic configuration of a semiconductor integrated circuit to which the invention is applied. Circuit blocks shown in FIG. 2 are all formed on a single semiconductor chip made of single crystal silicon or the like. Symbol ⊙ denotes a pad as an external terminal provided for the semiconductor chip. Only pads related to the invention are shown out of external terminals actually provided. Other than the external terminals, external terminals and source voltage terminal for the inherent functions of the chip are provided.

In FIG. 2, MCL1, MCL2, . . . MCLn denote RAM macro cells as built-in memories and LGC11, LGC12, . . . LGC2n indicate logic circuits for realizing inherent logic functions (system logics) of the chip. Each of the RAM macro cells MCL1, MCL2, . . . MCS has, as will be described in detail hereinlater, a memory array, not only a decoder for selection, and a read/write circuit, but also a spare memory column by which a defective bit can be replaced, a replacement control circuit, a test auxiliary circuit for facilitating a test of a memory, and the like.

In the specification, the RAM macro cell is a memory circuit which is designed and subjected to an operation check in advance. It is sufficient to select RAMs having desired storage capacities and performances out of a plurality of RAMs registered in a database or the like and dispose the selected RAMs on the chip, thereby enabling detailed circuit designing to be omitted. Examples of the macro cell are, other than the RAM, circuits often used in a logic LSI such as ROM, arithmetic logic circuit, PLL (Phase-Locked Loop) circuit, and clock amplifier.

In the embodiment, the setting circuit 10, the memory diagnosis controller 20, and the dedicated memory control bus 30 are provided. The setting circuit 10 includes a fuse array for setting information for identifying the RAMmacro cells MCL1, MCL2, . . . MCLn and defective address information. The memory diagnosis controller 20 has timing control functions of generating a control signal FSET and a shift clock signal SCK to the setting circuit 10 on the basis of test mode setting signals TMODE0 to TMODE2, a trigger signal TRIG, and a control pulse PULSE from external terminals, reading the information FDATA set in the setting circuit 10, and transferring the read information FDATA to the RAM macro cells MCL1, MCL2, . . . MCLn and the function of serial-parallel converting the setting information. The dedicated memory control bus 30 supplies the setting information from the memory diagnosis controller 20 to the RAM macro cells MCL1, MCL2, . . . MCLn. Although not limited, the memory control bus 30 consists of 17 bits. The test mode setting signals TMODE0 to TMODE2 are outputted as they are by using the three bits out of 17 bits, information regarding the setting read from the setting circuit 10 and transferred to the RAM macro cells MCL1, MCL2, . . . MCLn is outputted by using 13 bits, and a signal for giving a timing of latching the setting information is outputted by using the remaining one bit.

Although not limited, in the embodiment, a memory test circuit 40 including a pattern generator for generating a test pattern for testing the RAM macro cells MCL1, MCL2, . . . MCLn built in the chip is provided. The pattern generator can use a circuit of an FSM (finite state machine) type or a microprogram type. Since the memory test circuit uses the BIST (Built-In Self Test) technique already established, its detailed description will not be given. On receipt of a memory test start signal MBISTSTART supplied from the outside, the memory test circuit 40 generates a test pattern and a test control signal and supplies them to the RAM macro cells MCL1, MCL2, . . . MCLn via a test signal line 50.

It is also possible to provide an input terminal TESTIN for testing to be connected to the test signal line 50 as shown by a broken line A in place of forming the memory test circuit 40 on the chip and enter a signal or a fixed pattern similar to the test pattern and the test control signal generated by an external memory test circuit from the input terminal TESTIN for testing to test the RAM macro cells MCL1, MCL2, . . . MCLn.

Figure 3:
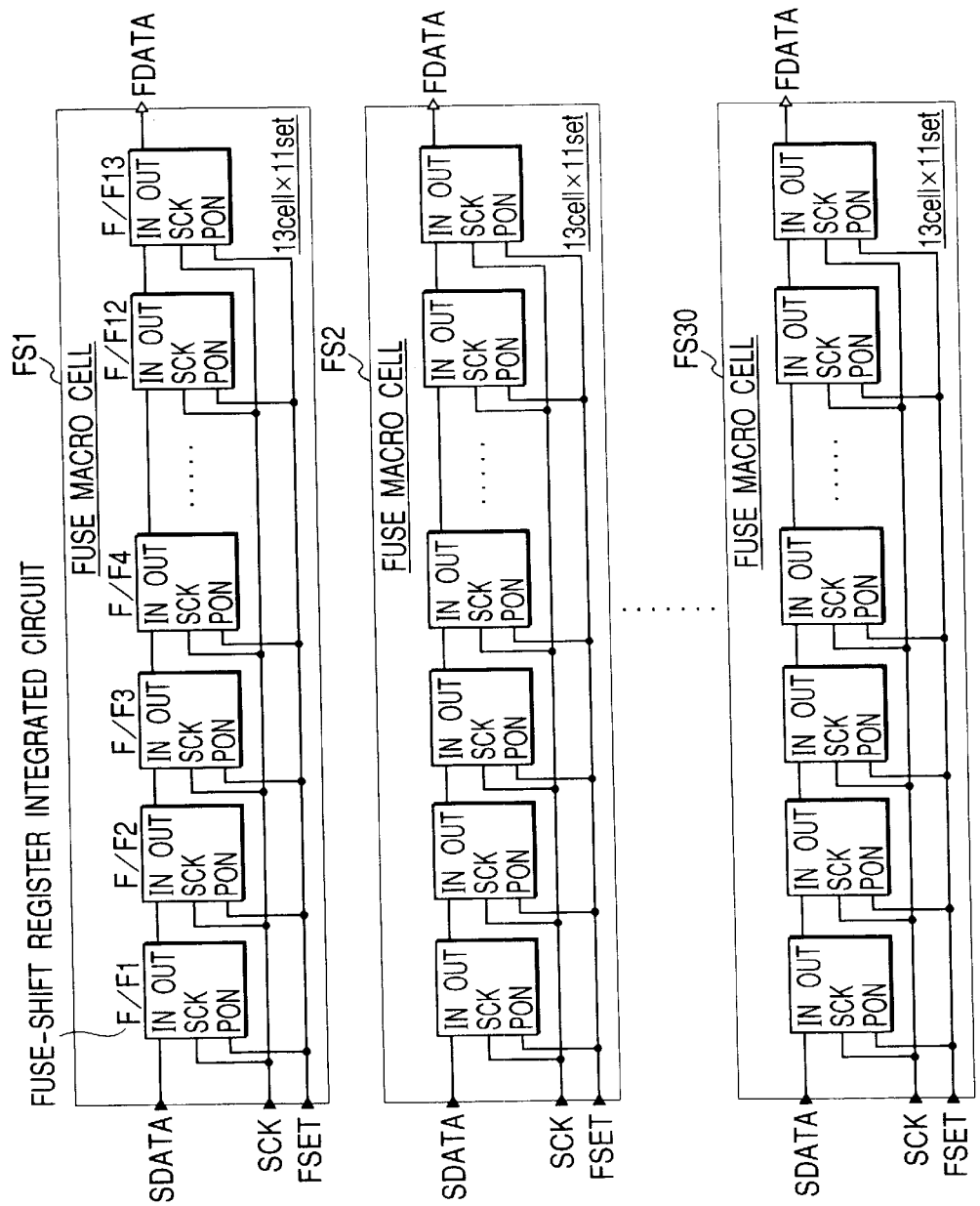
FIG. 3 is a block diagram of a shift register constructing a setting circuit.

FIG. 3 shows an example of the configuration of the shift register constructing the setting circuit. In FIG. 3, each flip flop is shown as a flip flop having therein a fuse. As shown in FIG. 3, the shift register of the embodiment has thirty fuse sets FS1 to FS30 each consisting of thirteen cascade-connected flip flops F/F1 to F/F13. The sets are also cascade-connected, and held data is shifted bit by bit in response to shift clocks SCK commonly applied to the flip flops. FSET denotes a fuse set signal for allowing all of the flip flops to capture and hold the state of the fuse.

Each of the 13 flip flops F/F1 to F/F13 in one fuse set is comprised of a bit B1 indicative of use, bits B2 to B7 indicative of the ID code of a RAM macro cell, and B8 to B13 indicative of a repair address code or timing adjustment code. The bit B1 indicative of use is a bit indicating that the code of B8 to B13 is either a repairing address code or a timing adjustment code. Specifically, when the bit B1 is "0", it represents that the code of B8 to B13 is a repair address code. When the bit B1 is "1", it represents that the code of B8 to B13 is a timing adjustment code. Further, when the code of B8 to B13 is the timing adjustment code, the first four bits indicate adjustment information of an activating timing of a sense amplifier and the following two bits indicate adjustment information of a pulse width of a word driving pulse.

In the bits B2 to B7 indicative of the ID code of the RAM acro cell, the bits B2 and B3 represent the type of the macro ell, and the bits B4 to B7 represent the macro cell number. Table 1 shows an example of the relation between the kind of the macro cell and the bits B2 and B3.

TABLE 1

| B2, B3 | Type of RAM | Word length | Data bit width | Redundant data bit |
|---|---|---|---|---|
| 0 0 | macro cell A | 4 kW | 36 | 1 |
| 0 1 | macro cell B | 2 kW | 36 | 1 |
| 1 0 | macro cell C | 1 kW | 36 | 1 |

As shown in Table 1, when the bits B2 and B3 are "00", it represents that the designated RAM macro cell is a cell having a storage capacity of 4 k word. When the bits B2 and B3 are "01", it represents that the designated RAM macro cell is a cell having a storage capacity of 2 k word. When the bits B2 and B3 are "10", it represents that the designated RAM macro cell is a cell having a storage capacity of 1 k word.

Further, when the bits B2 and B3 are "11", it represents that all the RAM macro cells are designated. The designation of the RAM macro cell by the bits B2 and B3 is valid mainly when the bit B1 is "1" and the bits B8 to B13 represent a timing adjustment code. Since the RAMs of the same type in the same chip have similar properties, it is desirable to adjust the timings of the RAMs in a lump.

Although not limited, the "word" in the embodiment denotes data having a bit length of 36 bits. The types of the RAM macro cells are not limited to those shown in Table 1. The word length is not necessarily 36 bits. The cells may have word lengths different from each other.

Figure 5:
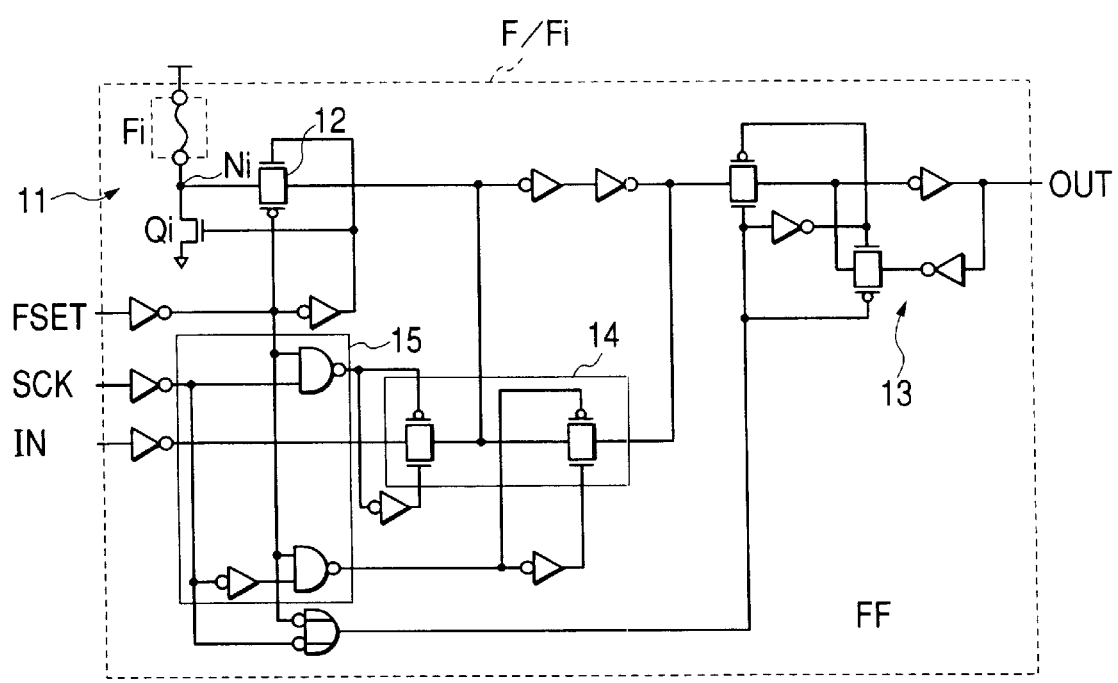
FIG. 5 shows a concrete example of a flip flop having therein a fuse constructing the setting circuit having the shift register function of FIG. 3.

FIG. 5 shows a concrete example of the flip flops F/F1 to F/F13 built in the fuse as a component of the setting circuit 10 having the shift register function of FIG. 3.

As shown in FIG. 5, each of the flip flops includes: a state setting means 11 having a fuse Fi and a MOSFET Qi connected to the fuse Fi in series, for generating a potential (Vcc or GND) according to the state (disconnected or connected) of the fuse Fi at a connection node Ni; a transfer gate 12 for transmitting the potential set by the state setting means 11 to the inside by the fuse set signal FSET supplied from the memory diagnosis controller 20; a latch circuit 13 for holding the potential state transmitted by the transfer gate 12; and a transfer gate 14 for transmitting data input to a data input terminal IN to the latch circuit 13 or interrupting the data. A logic circuit 15 is also provided for generating a signal for controlling the transfer gate 14 so as to transmit the data input to the data input terminal IN to the latch circuit 13 synchronously with the shift clock SCK supplied from the memory diagnosis controller 20 when the fuse set signal FSET is negated to the low level.

Figure 6:
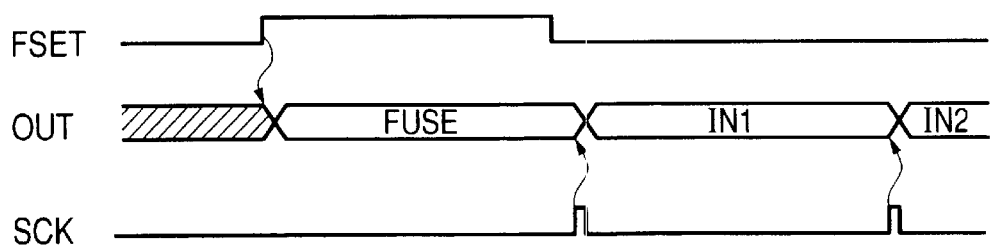
FIG. 6 is an operation timing chart of the flip flop having therein the fuse of FIG. 5.

When the fuse set signal FSET is asserted to the high level as shown in FIG. 6, the flip flop having the fuse shown in FIG. 5 constructing the setting circuit 10 having the shift register function latches the state FUSE of the fuse in the latch circuit 13. When the shift clock SCK is supplied in a state where the fuse set signal FSET is negated to the low level, the flip flop operates to latch the data input to the data input terminal IN by the latch circuit 13 synchronously with the rising edge of the shift clock SCK. The data latched by the latch circuit 13 is supplied from an output terminal OUT to the data input terminal IN of the flip flop at the next stage.

In the circuit of the embodiment, therefore, the fuse set signal FSET is first changed to the high level to latch the state FUSE of the fuse by the latch circuit 13, and the shift clock SCK is continuously changed, thereby enabling the data held by the flip flop to be shifted to the flip flop at the next stage. The transfer gate 14 is constructed by double gates to prevent what is called racing that data input to the data input terminal IN is outputted directly from the output terminal OUT.

A concrete example of the memory diagnosis controller 20 will now be described with reference to FIGS. 7 to 9.

Figure 7:
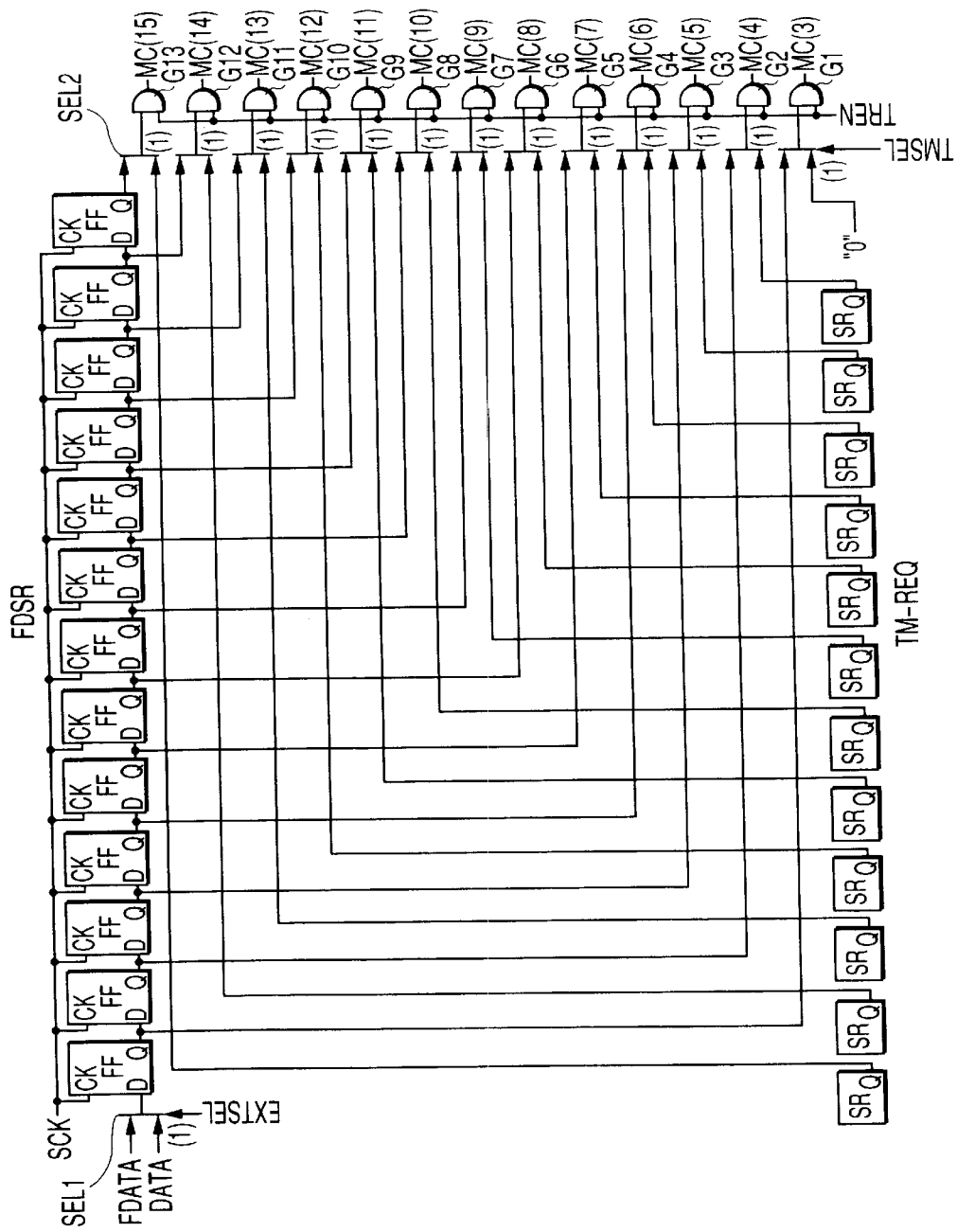
FIG. 7 shows a concrete example of a serial-parallel converting circuit and a mode register for a RAM test in a memory diagnosis controller.

FIG. 7 shows a concrete example of a serial-parallel converting circuit and a mode register for RAM test among the various functions of the memory diagnosis controller 20. The serial-parallel converting circuit includes a shift register FDSR constructed by cascade-connected 13 flip flops and 13 AND gates G1 to G13 each having one input connected to an output of each flip flop and the other input for receiving a transfer permission signal TREN. The fuse setting information FDATA from the fuse sets FS1 to FS30 of the embodiment (FIG. 3) or the input data DATA from the external terminal can be selectively supplied via a selector SEL1 to the shift register FDSR consisting of the flip flops.

Separately from the shift register FDSR for shifting the fuse setting information, a mode register TM-REG for holding data for RAM test is also provided. At the ante-stage of the AND gates G1 to G13, a selector group SEL2 for selectively supplying an output of the shift register FDSR or the mode register TM-REG to the AND gates G1 to G13 is provided. The mode register TM-REG is provided on a scan path used for a test of the logic or a boundary-scan test. The data for RAM test is set in the mode register TM-REG via the scan path.

Figure 8:
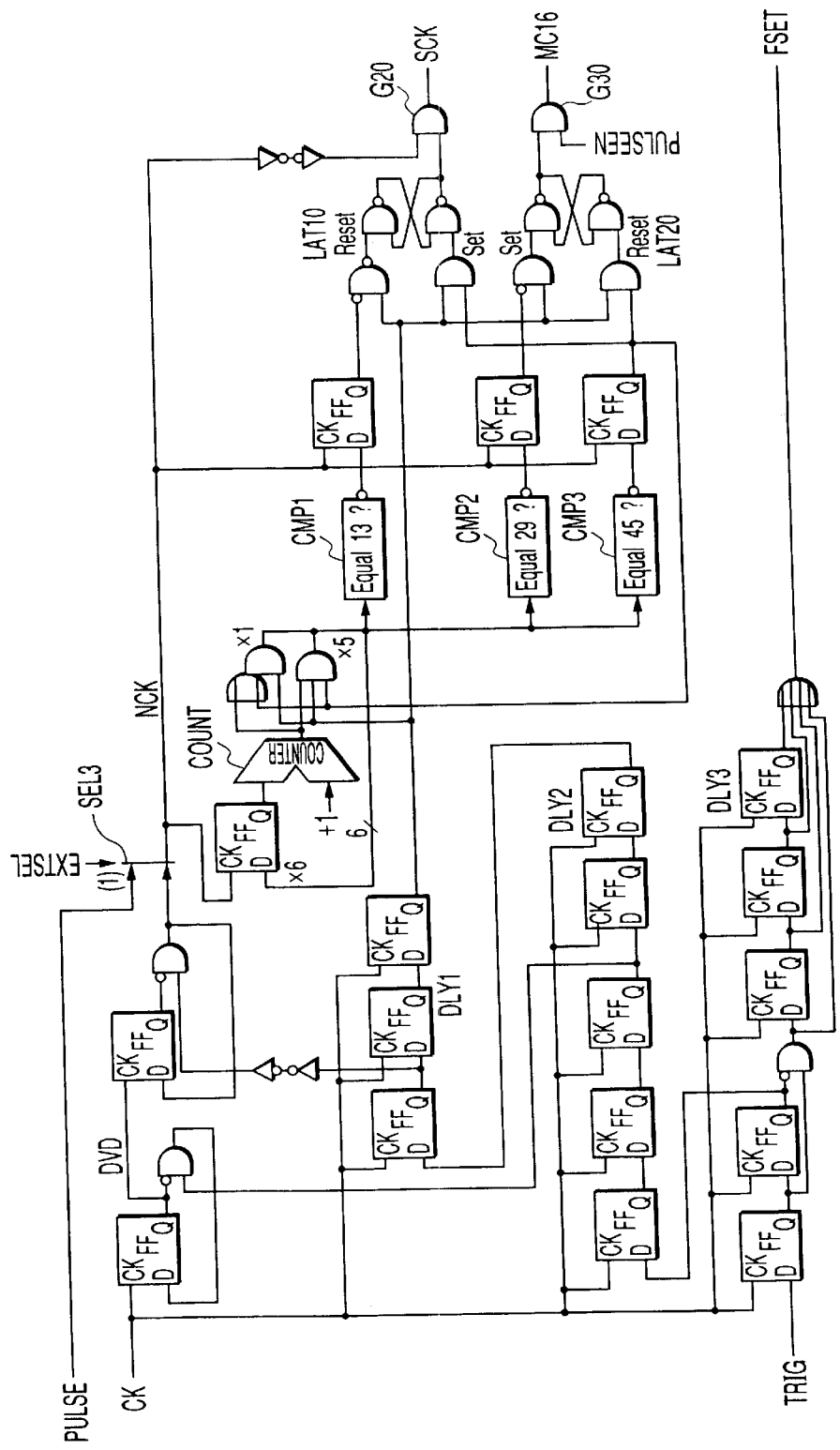
FIG. 8 is a block diagram of a memory diagnosis controller.
Figure 9:
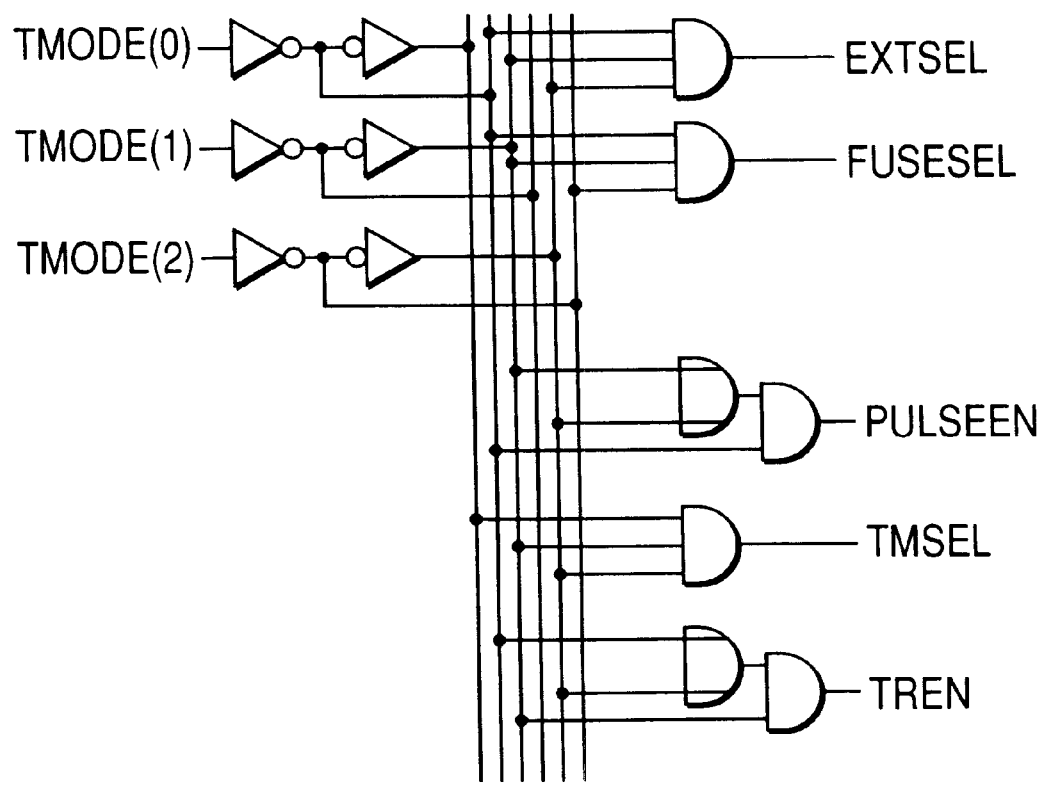
FIG. 9 is a circuit configuration diagram showing an example of a decoder of a test mode signal in the memory diagnosis controller.

FIG. 8 shows a signal generating circuit for generating the control signal FSET and the shift clock SCK to the fuse sets FS1 to FS30 and a latch timing signal (MC16) to be outputted on the memory control bus 30 on the basis of the trigger signal TRIG, the control pulse PULSE, and a clock CK which are input from the external terminal. FIG. 9 shows a decoder for generating the transfer permission signal TREN for controlling the AND gates G1 to G13, signals EXTSEL and TMSEL for controlling the selectors SEL1 and SEL2, and the like on the basis of the test mode setting signals TMODE0 to TMODE2 input from the external terminal.

In FIG. 8, DVD denotes a frequency divider for dividing the clock CK from the outside. By the frequency divider DVD, the shift clock SCK having the frequency which is ¼ of the clock CK is generated. DLY1 to DLY3 denote delay circuits for delaying an internal signal only by a proper time. COUNT denotes a counter circuit for counting the number of internal clocks NCK. CMP1 to CMP3 indicate comparators for determining whether or not the count value of the counter circuit has reached "13", "29", and "45", respectively. The comparator CMP1 is used to count the shift clocks SCK every 13 clocks, interrupt the shifting of serially transferred data every 13 bits, that is, each time data of one fuse set is received, convert the data to parallel data, and output the parallel data onto the memory control bus 30. By the output of the comparator CMP1, a latch circuit LAT10 is reset, and an AND gate G20 stops outputting the shift clock SCK.

The comparator CMP2 is provided to give a timing to the RAM macro cell to capture the signal on the memory control bus 30. The comparator CMP3 is provided to give a timing for the RAM macro cell to finish capturing the signal on the memory control bus 30. When the comparator CMP2 counts 29 internal clocks NCK since the start of capturing the serial data from the fuse setting circuit 10, a latch circuit LAT20 is set by the output of the comparator CMP2, and an AND gate G30 sets the signal MC16 on the bus for giving the data capturing timing of the RAM macro cell to the high level. When the comparator CMP3 counts 45 internal clocks NCK since the start of capturing of the serial data from the fuse setting circuit 10, the latch circuit LAT20 is reset by the output of the comparator CMP30, and the AND gate G30 sets the signal MC16 for giving the data capturing timing of the RAM macro cell to the low level.

Figure 10:
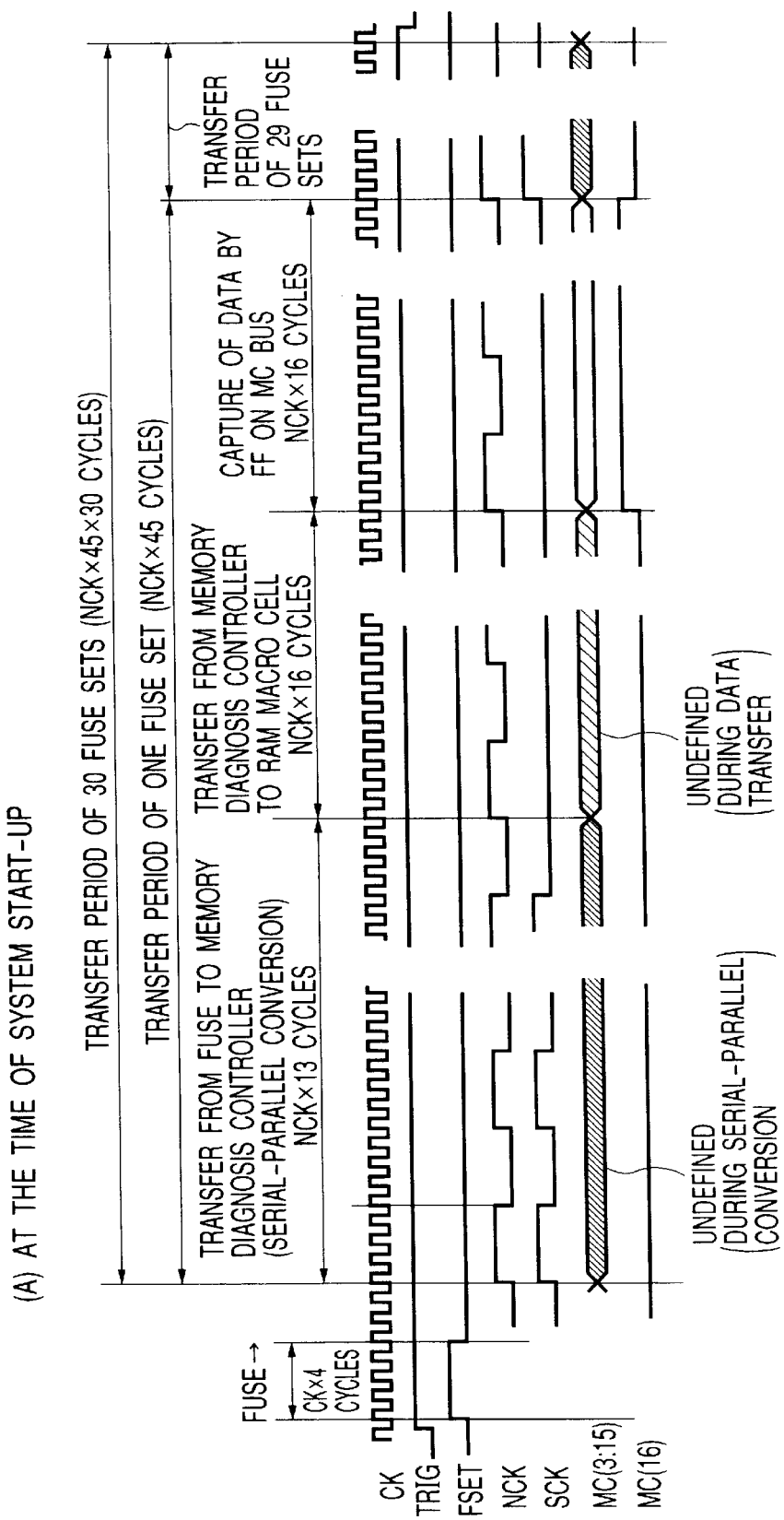
FIG. 10 is a transfer timing chart of a memory control bus.

FIG. 10 shows the relations among the clock signal CK and the trigger signal TRIG input to the circuit of FIG. 8, the internal clock NCK of the circuit of FIG. 8, the signal fuse set signal FSET, shift clock SCK, and bus output signals MC3 to MC15 and MC16 outputted from the circuit of FIG. 8. As understood from FIG. 10, the shift clocks SCK are outputted in 13 cycles of the internal clocks NCK and serial data from the fuse setting circuit 10 is captured. In the following 16 cycles, signals are outputted from the memory diagnosis controller 20 onto the memory control bus 30. During the period, the RAM macro cell decodes the signals B3 to B9 indicative of the macro cell number on the bus to determine whether the data is addressed to itself. In the following 16 cycles, information signals B10 to B15 on the memory control bus 30 to the RAM macro cell are latched. The above operation requiring total 45 cycles is repeated only by 30 times as the number of fuse sets, all of fuse setting information is transferred to the corresponding RAM macro cell.

In the memory diagnosis control circuit 20, as shown in FIG. 8, a selector SEL3 is provided at the next stage of the frequency divider DVD. Consequently, the memory diagnosis control circuit 20 can operate by the control pulse PULSE from the outside in place of the clock signal CK. The selector SEL3 is controlled by the control signal EXTSEL also used for the selector SEL for switching data. When the control pulse PULSE is input and the memory diagnosis control circuit 20 operates, data entered from the external terminal is captured and transferred to the RAM macro cell.

Such switching of the operation of the memory diagnosis control circuit 20 is performed according to the test mode setting signals TMODE0 to TMODE2 supplied from the outside. Although not limited, in the embodiment, the test mode setting signals TMODE0 to TMODE2 are outputted as MC0 to MC2 onto the memory control bus 30 and supplied to the RAM macro cells MCL1 to MCLn. Table 2 shows the relation between the test mode setting signals TMODE0 to TMODE2 and an operation mode designated by the signals.

TABLE 2

| | | Mode designation*1 | | | Transfer information | | | | | | | | | | | | | MC bus Reception latch trigger signal | |
|---|---|---|---|---|---|---|---|---|---|---|---|---|---|---|---|---|---|---|---|
| # | Operation mode | 0 | 1 | 2 | 3 | 4 | 5 | 6 | 7 | 8 | 9 | 10 | 11 | 12 | 13 | 14 | 15 | 16 | Remarks |
| 1 | System operation | 0 | 0 | 0 | 0 | 0 | 0 | 0 | 0 | 0 | 0 | 0 | 0 | 0 | 0 | 0 | 0 | 0 | |
| 2 | MC bus reception latch reset | 0 | 0 | 1 | 0 | 0 | 0 | 0 | 0 | 0 | 0 | 0 | 0 | 0 | 0 | 0 | 0 |  | |
| 3 | Repair address/timing information transfer (FUSE transfer) | 0 | 1 | 0 | Use | Macro type | | Macro number | | | Repair address/ timing information | | | | | | |  | Information of FUSE macro cell is transferred to transfer information field |
| 4 | Repair address/timing information transfer (external terminal input) | 0 | 1 | 1 | Use | Macro type | | Macro number | | | Repair address/ timing information | | | | | | | 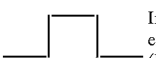 | Information from external terminal (DATA terminal) is transferred to transfer information field |

TABLE 2-continued

| | | Mode designation[1] | | | MC bus | | | | | | | | | | | | | Reception latch trigger signal | |
| | | | | | Transfer information | | | | | | | | | | | | | | |
| # | Operation mode | 0 | 1 | 2 | 3 | 4 | 5 | 6 | 7 | 8 | 9 | 10 | 11 | 12 | 13 | 14 | 15 | 16 | Remarks |
| 5 | RAM cycle test mode | 1 | 1 | 1 | 0 | macro type | | | Macro number | | | Data bits to be tested | | | | | | 0 | Data in TM register in memory diagnosis controller is transferred |

[1]to be set in TMODE (0:2) terminal

As shown in Table 2, when TMODE0 to TMODE2 are set to "000", the memory diagnosis control circuit 20 stops its operation and a system operation mode is set. When TMODE0 to TMODE2 are set to "001", the memory diagnosis control circuit 20 sets only the signal MC16 on the memory control bus 30 to the high level to reset receiving latch circuits 121 and 122 of each of the RAM macro cells MCL1 to MCLn.

When TMODE0 to TMODE2 are set to "010", the control signal EXTSEL goes low. The memory diagnosis control circuit 20 captures the setting data FDATA of the fuse setting circuit 10, converts it to parallel data, outputs the parallel data onto the memory control bus 30, and transfers the data to the latches 121 and 122 of the RAM macro cells MCL1 to MCLn. When TMODE0 to TMODE2 are set to "011", the control signal EXTSEL goes high, and the memory diagnosis control circuit 20 captures the data DATA from the external terminal, converts it to parallel data, outputs the parallel data onto the memory control bus 30, and transfers the data to the latches 121 and 122 of the RAM macro cell. Further, when TMODE0 to TMODE2 are set to "111", the memory diagnosis control circuit 20 enters a RAM cycle test operation mode. Data in the test mode register TM-REG provided on the inside of the memory diagnosis control circuit 20 is transferred to the RAM macro cells MCL1 to MCLn.

Figure 11:
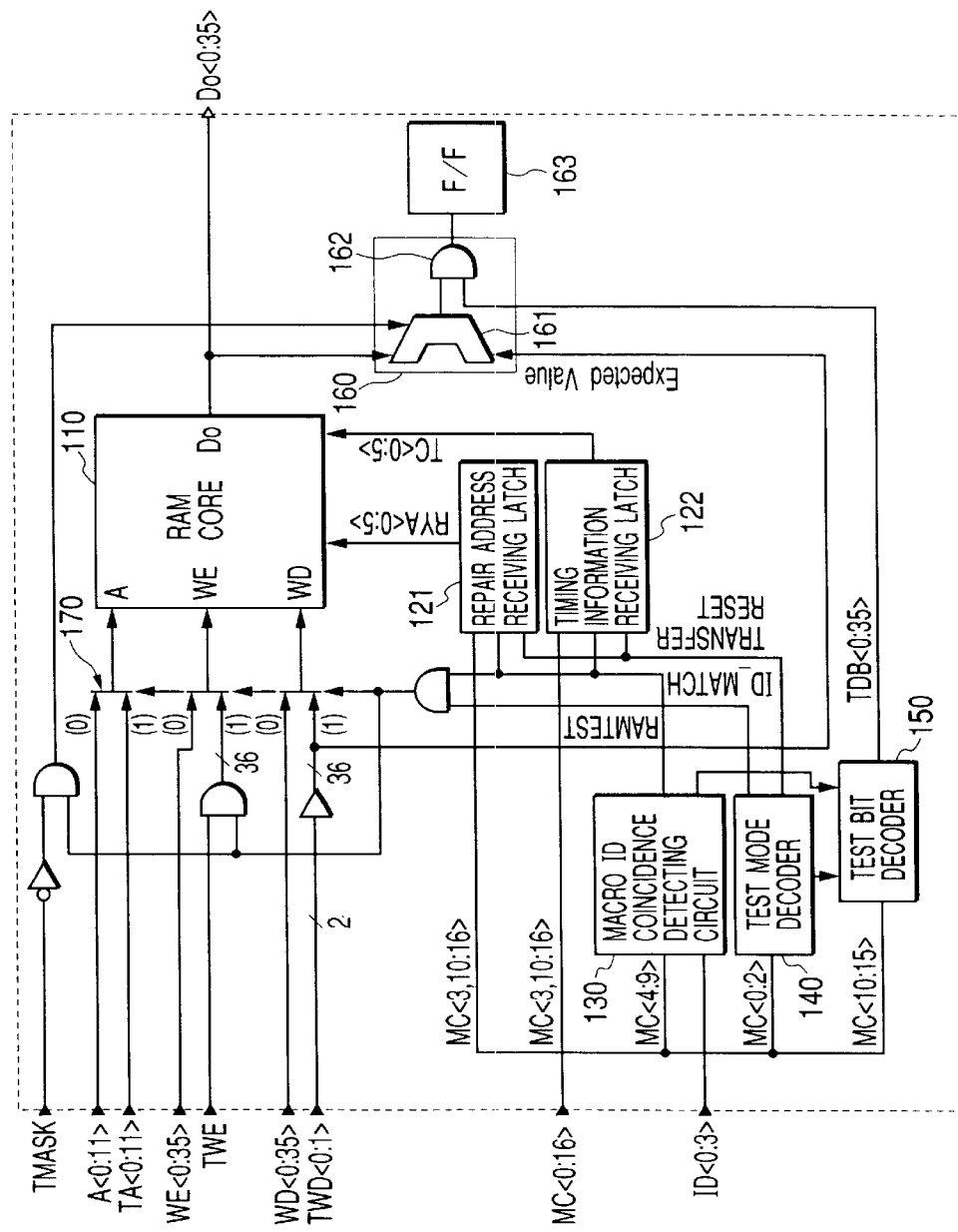
FIG. 11 is a block diagram showing an example of a RAM macro cell.

Referring to FIG. 11, the configuration of the RAM macro cells MCL1 to MCLn will be described.

The RAM macro cell MCL of the embodiment includes: a RAM core 110 including a memory array in which a plurality of memory cells are arranged in a matrix and peripheral circuits such as a redundancy circuit; the repair address receiving latch 121 for receiving, from the memory control bus 30, a repair address to replace a defective bit in the RAM core 110 with a spare memory cell and holding the captured repair address; the timing information receiving latch 122 for receiving timing information for adjusting the timing of a signal in the RAM core 110 from the memory control bus 30 and holding the timing information; a macro ID coincidence detecting circuit 130 for detecting whether or not an ID code (macro ID) of a RAM macro cell supplied from the memory control bus 30 coincides with a code preliminarily given to itself; a test mode decoder 140 for decoding the test mode signals TMODE0 to TMODE2 supplied from the memory control bus 30 and generating a control signal according to the mode; a test bit decoder 150 for decoding the code (MC10 to MC15) supplied from the memory control bus 30 in a test mode and generating signals TDB0 to TDB35 for designating a bit to be tested; a test result comparison-determining circuit 160 for comparing read data with expected value data and determining whether they coincide with each other or not in the test mode; and a selector group 170 for selecting any of an address signal A, a read/write control signal WE, and write data WD supplied from a system logic circuit having the inherent function of the LSI or an address signal TA, a read/write control signal TWE, and test write data TWD supplied from the memory test circuit 40.

Figure 12:
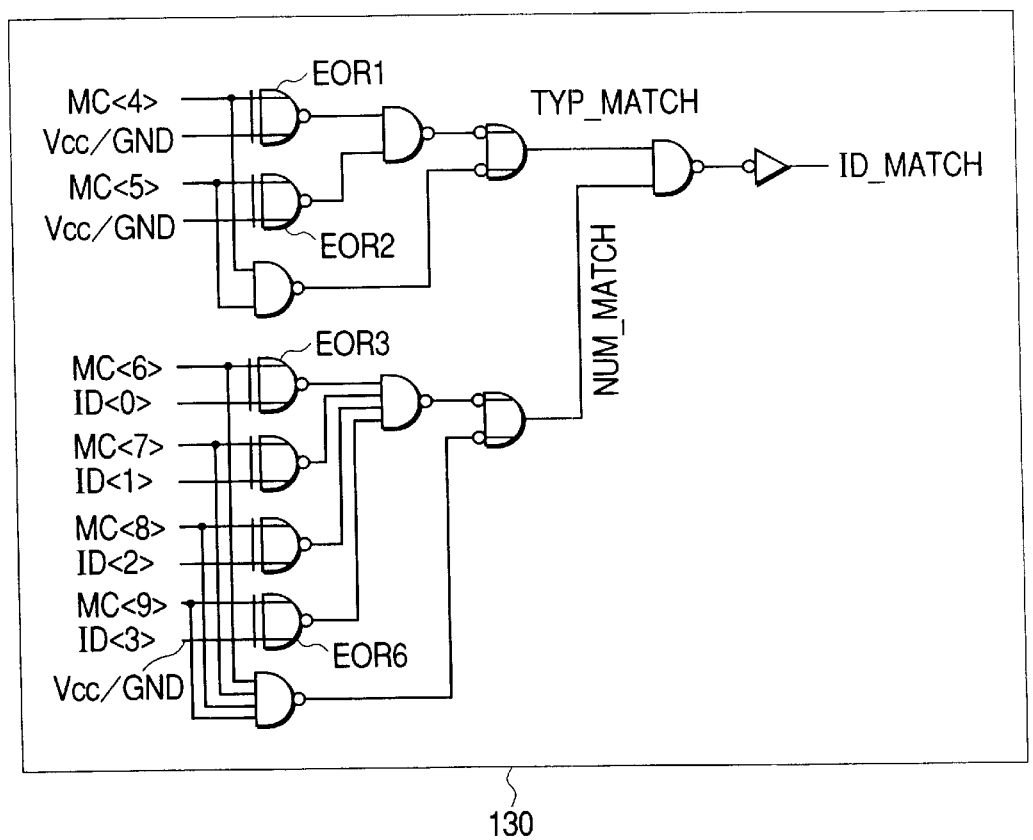
FIG. 12 is a block diagram showing an example of a macro coincidence detecting circuit.

The macro ID coincidence detecting circuit 130 includes, as shown in FIG. 12, exclusive OR gates EOR1 to EOR6 for receiving the signals MC4 to MC9 on the memory control bus 30, respectively, as input signals to their input terminals. The other input terminal of each of the gates EOR1 to EOR6 is connected to, for example, the power source voltage VCC or the ground GND via a master-slice type line. When the signals MC4 and MC5 indicative of the type of the macro cell coincide with a preset state, a macro type match signal TYP-MATCH is generated. When the signals MC6 to MC9 indicative of the macro cell number match with a preset state, a macro number match signal NUM-MATCH is generated. When all the signals match with the preset states, an ID match signal ID-MATCH of a high level is output.

Figure 13:
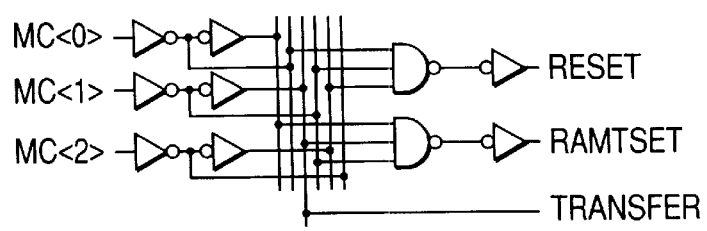
FIG. 13 is a block diagram showing an example of a test mode decoder.

The test mode decoder 140 has, as shown in FIG. 13, a configuration similar to that of a known address decoder and decodes the signals MC0 to MC2 on the memory control bus 30. For example, as shown in Table 3, when MC0, MC1, and MC2 are "001", the reset signal RESET to the latches 121 and 122 is set to the logic "1". When MC0, MC1, and MC2 are "111", a control signal RAMTEST for switching the selector group 170 to a test signal side is set to the logic "1". When MC1 is "1", irrespective of MC0 and MC2, a latch signal TRANSFER to the latches 121 and 122 is set to the logic "1".

TABLE 3

| MC0 | MC1 | MC2 | |
|---|---|---|---|
| 0 | 0 | 0 | RESET = "1" |
| 1 | 1 | 1 | RAMTEST = "1" |
| * | 1 | * | TRANSFER = "1" |

Figure 14:
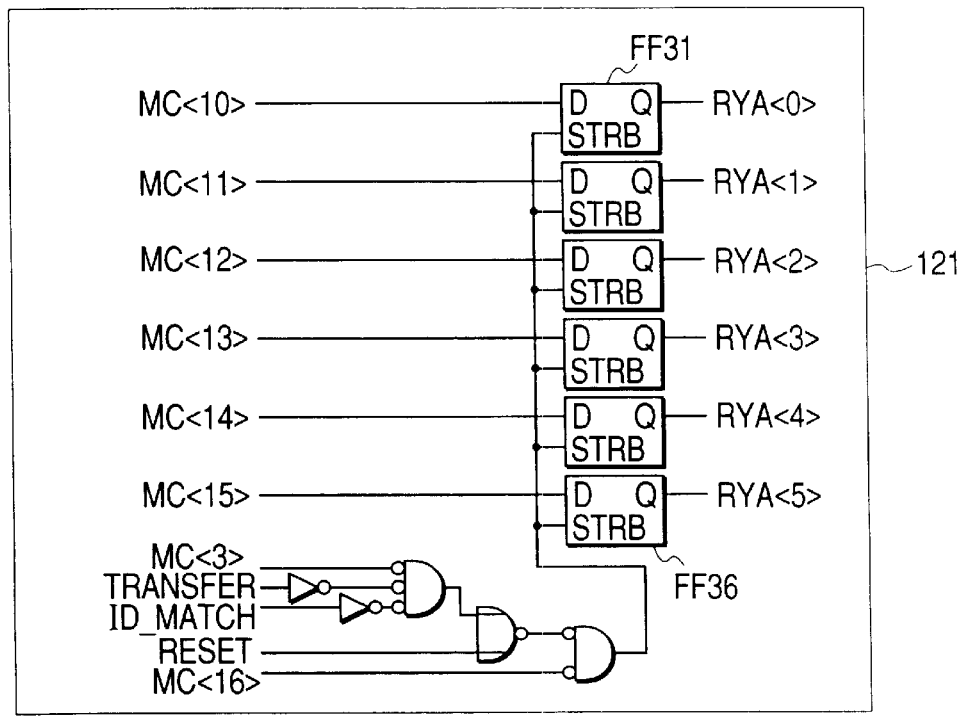
FIG. 14 is a circuit configuration diagram showing an example of a repair address receiving latch.
Figure 15:
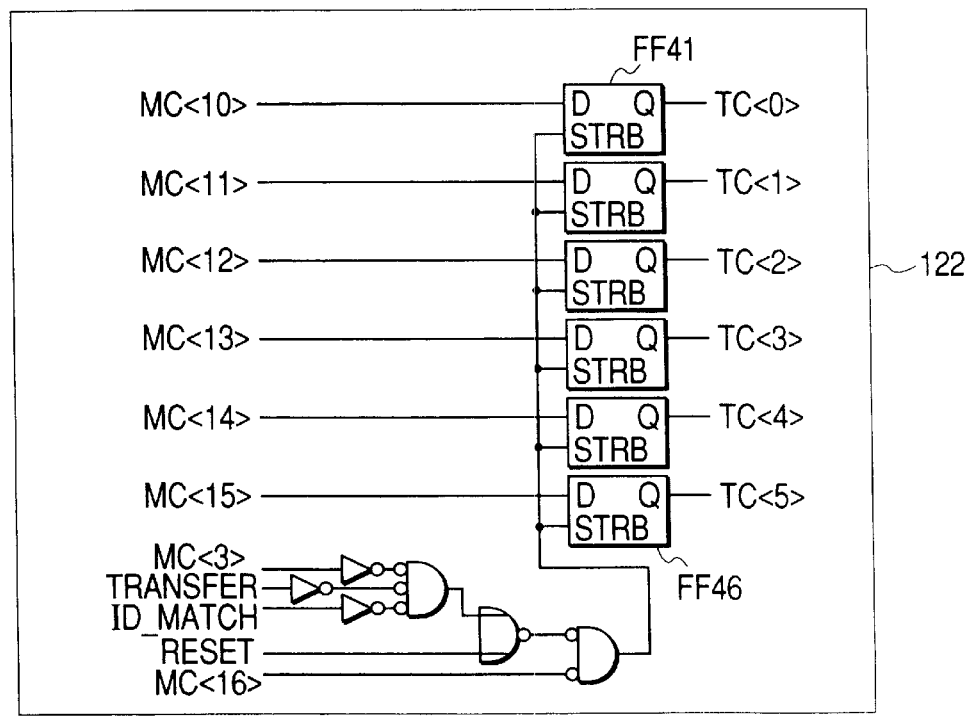
FIG. 15 is a circuit configuration diagram showing an example of a timing information receiving latch.

The repair address receiving latch 121 and the timing information receiving latch 122 have the configurations as shown in FIGS. 14 and 15, respectively. On the basis of the signals MC3 and MC16 and the control signals TRANSFER, ID-MATCH, and RESET on the memory control bus 30, latch strobe signals STRB to the flip flops FF31 to FF36 and FF41 to FF46 are generated. When the signals become in a predetermined combination, the signals MC10 to MC15 on the memory control bus 30 are latched. The latched signals are supplied as repair addresses RYA0 to RYA5 from the repair address receiving latch 121 to the RAM core 110, and as timing signals TC0 to TC5 from the timing information receiving latch 122 to the RAM core 110.

The signal MC3 on the bus is, as obviously understood also from Table 2, a signal indicative of a use, that is, either address repair or timing adjustment. The signal MC16 is a signal indicating whether the signals are latched or not. The difference between the circuits of FIGS. 14 and 15 is only whether there is an inverter at an input terminal of the signal MC3 on the bus or not. When the signal MC3 has the logic "0" indicative of address repair, the latch in FIG. 14 latches the signals MC10 and MC15 on the memory control bus 30 by the flip flops FF31 to FF36. When the signal MC3 has the logic "1" indicative of timing adjustment, the latch in FIG. 15 latches the signals MC10 to MC15 on the memory control bus 30 by the flip flops FF44 to FF46. As the flip flops FF31 to FF36 and FF41 to FF46, general D-type flip flops can be used.

The test bit decoder 150 decodes the signals MC10 to MC15 on the memory control bus 30 and, for example, as shown in Table 4, generates the signals TDB0 to TDB35 for designating bits to be tested out of 36 data bits D0 to D35. Although not limited, when all the MC10 to MC15 are "1", all the data bits D0 to D35 are subjects to be tested. The test bit decoder 150 decodes the signals MC10 to MC15 by using the RAM cycle test signal RAMTEST outputted from the test mode decoder 140 for decoding the signals MC0 to MC2 and the match detection signal from the macro ID coincidence detecting circuit 130 as enable signals.

TABLE 4

| Data bit to be tested | MC | | | | | |
|---|---|---|---|---|---|---|
| | 10 | 11 | 12 | 13 | 14 | 15 |
| D0 | 0 | 0 | 0 | 0 | 0 | 0 |
| D1 | 0 | 0 | 0 | 0 | 0 | 1 |
| D2 | 0 | 0 | 0 | 0 | 1 | 0 |
| D3 | 0 | 0 | 0 | 0 | 1 | 1 |
| ... | | | ... | | | |
| D34 | 1 | 0 | 0 | 0 | 1 | 0 |
| D35 | 1 | 0 | 0 | 0 | 1 | 1 |
| All data bits (36 bits) | 1 | 0 | 0 | 1 | 0 | 0 |

The test result comparison-determining circuit 160 includes: 36 comparators 161 provided corresponding to data of 36 bits, for comparing read data from the RAM core 110 with data supplied from the input terminal of the test write data TWD as expected value data; an AND gate 162 provided on the output side of each of the comparators 161, for receiving the bit designation signals TDB0 to TDB35 from the test bit decoder 150 as one of inputs; and a register 163 comprised of a flip flop group for storing outputs of the AND gate 162. The test result stored in the register 163 can be loaded to the outside of the chip via a scan path (not shown).

Figure 16:
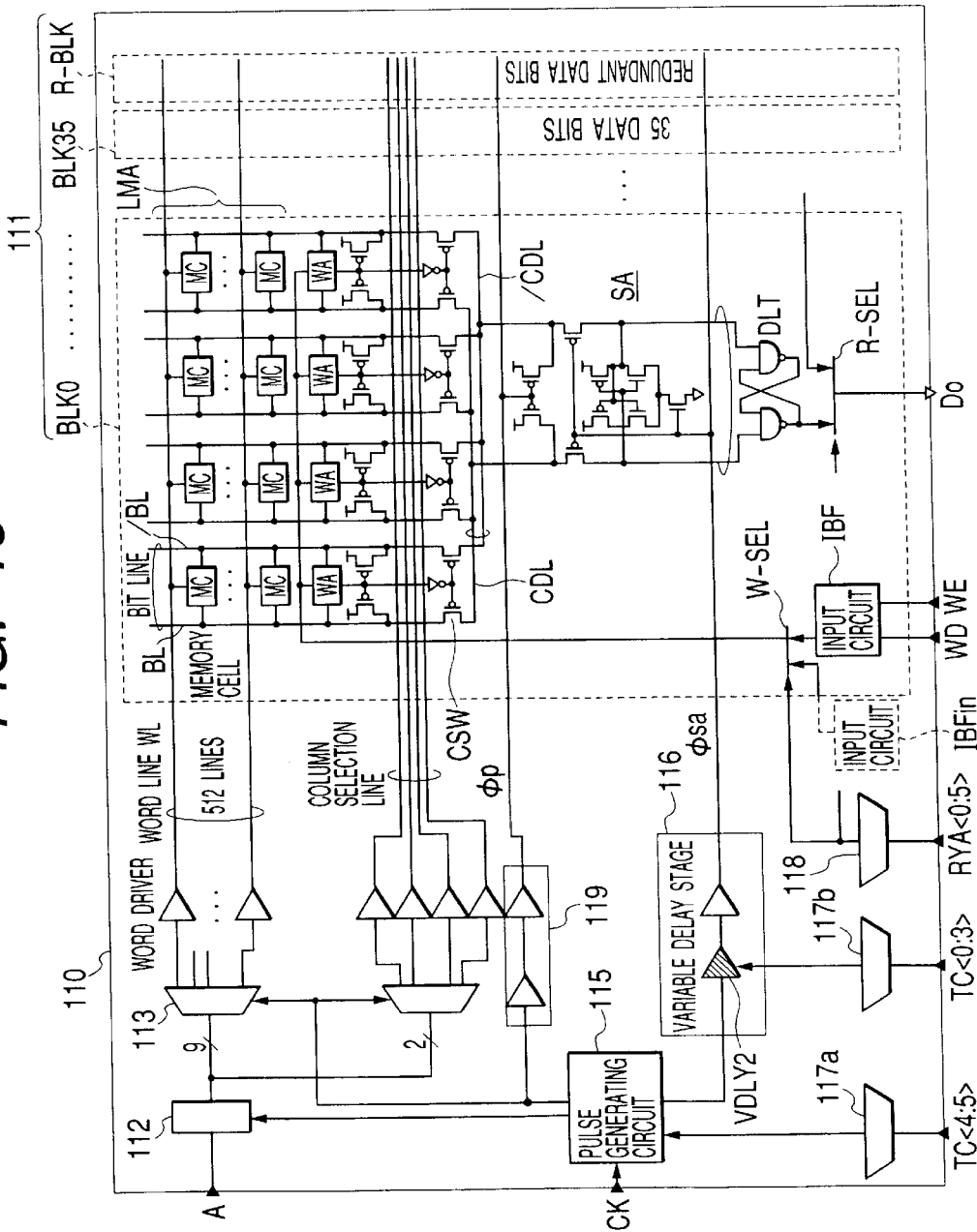
FIG. 16 is a circuit configuration diagram showing an example of a RAM core cell.

FIG. 16 shows a concrete example of the configuration of the RAM core 110. The RAM core 110 of the embodiment includes: a memory array 111 in which a plurality of memory cells MC are arranged in a matrix; an address latch 112 for latching an input address signal; a row address decoder 113 for decoding a row address signal and selecting one word line WL in the memory array corresponding to the decoded row address signal; a column address decoder 114 for decoding an input column address signal and selecting bit lines BL and /BL in the memory array; a pulse generating circuit 115 for generating a write pulse and the like; a timing circuit 116 for delaying a signal generated by the pulse generating circuit 115 to thereby generate an activate signal φsa of a sense amplifier in the memory array; an adjustment decoder 117a for decoding TC4 and TC5 out of the timing adjustment signals TC0 to TC5 supplied from the timing information receiving latch 122 and generating an adjustment signal to the pulse generating circuit 115; an adjustment decoder 117b for decoding TC0 to TC3 out of TC0 to TC5 and generating an adjustment signal to the timing circuit 116; a redundant decoder 118 for decoding the repair addresses RYA0 to RAY5 supplied from the repair address receiving latch 121 and generating a selector switch signal; and a timing circuit 119 for generating a precharge signal φp of common data lines CDL and /CDL in the memory array on the basis of the signal generated by the pulse generating circuit 115.

The memory array 111 is constructed by 36 memory blocks BLK0 to BLK35 in correspondence with the 36-bit data to be read/written at once and a memory block R-BLK for redundancy, that is, for spare. Each memory block includes a local memory array LMA, a column switch CSW for connecting a selected pair of bit lines in the local memory array LMA to the common data lines CDL and /CDL, a sense amplifier SA for amplifying a data signal read from the memory cell to the common data lines CDL and /CDL, a data latch DLT for latching read data amplified by the sense amplifier SA, a write amplifier WA for writing data to the selected memory cell on the basis of the read/write control signal WE and write data WD, an input circuit IBF for receiving the write data WD and the read/write control signal WE, a write selector W-SEL for selecting any of signals in the input circuit IBFin a neighboring memory block in accordance with a switch control signal from the redundancy decoder 118, and a read selector R-SEL for selecting any of signals in the data latch DLT in a neighboring memory block in accordance with a switching control signal from the redundancy decoder 118. The operation of the selectors will be described in detail hereinlater.

Figure 17:
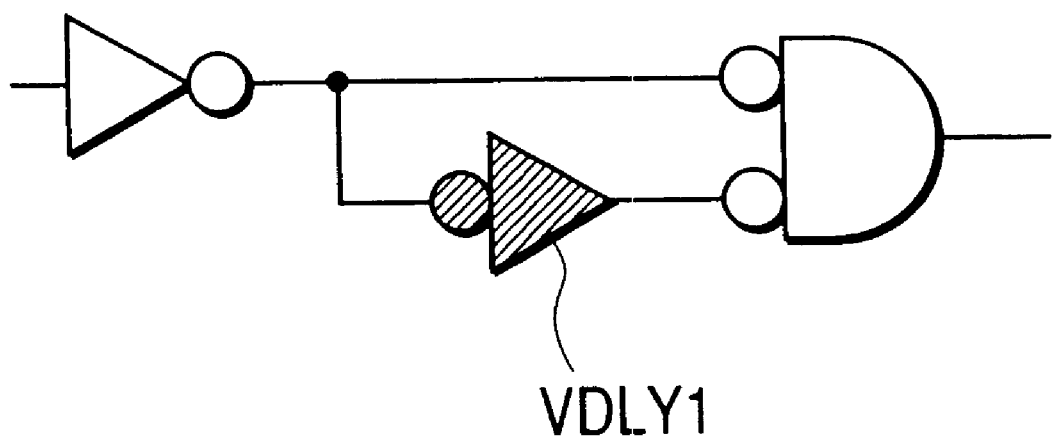
FIG. 17 is a circuit configuration diagram showing an example of a pulse generating circuit.

The pulse generating circuit 115 has, as shown in FIG. 17, a one-shot pulse generating circuit having a variable delay stage VDLY1 and is constructed so that the write pulse width can be adjusted by determining a delay amount in the variable delay stage VDLY1 by an adjustment signal from the adjustment decoder 117a. The timing circuit 116 has a variable delay stage VDLY2 and is constructed so that a sense amplifier activate timing can be adjusted by determining the delay amount in the variable delay stage VDLY2 by an adjustment signal from the adjustment decoder 117a.

A redundancy method in the embodiment will now be described by referring to FIG. 18.

Figure 18:
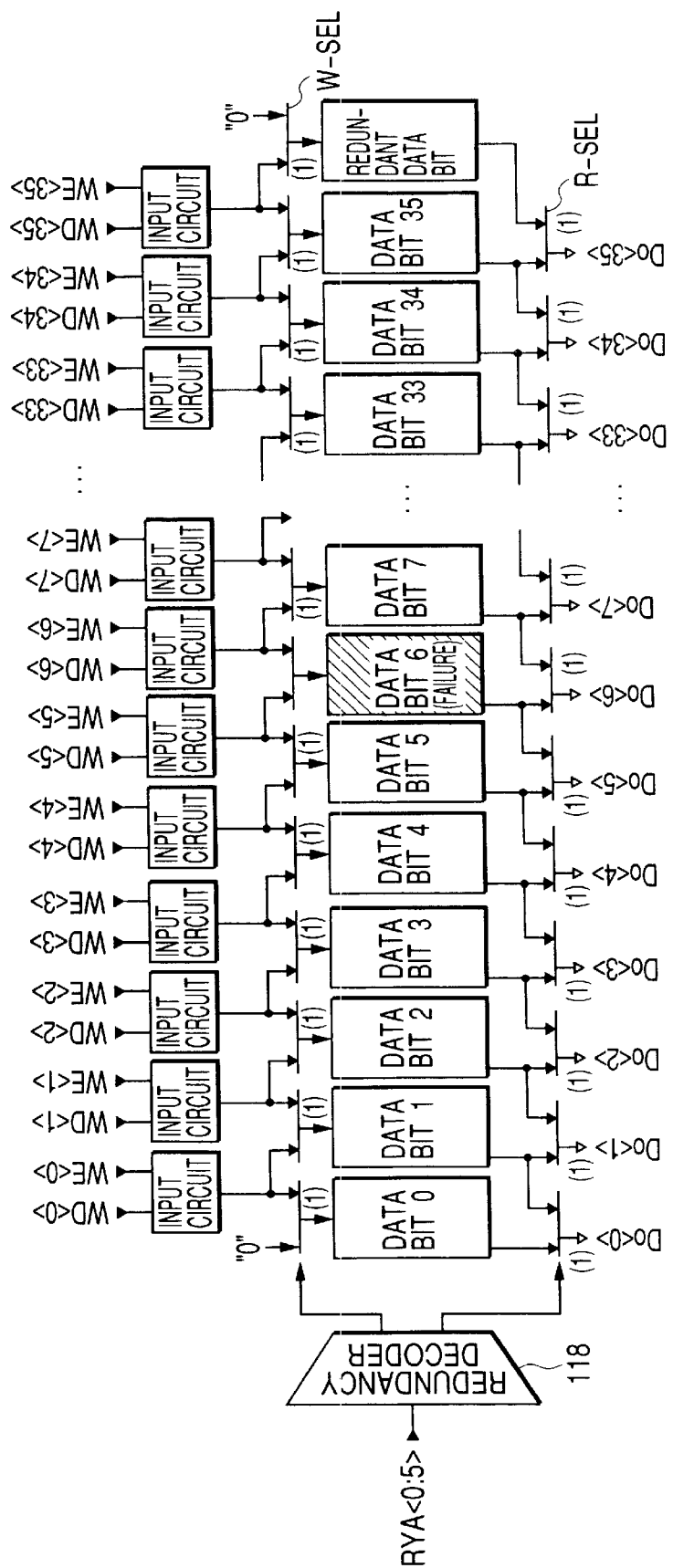
FIG. 18 is a diagram for explaining the operation in a data bit shifting type redundancy repairing method of the embodiment.

According to the redundancy method in the embodiment, as shown in FIG. 18, the write selector W-SEL and the read selector R-SEL each capable of shifting a data bit in one direction (in the diagram, from the right to the left, that is, from the side where there are the memory blocks for redundancy to the side where there are no memory blocks for redundancy) between neighboring memory blocks are provided. When there is a memory block including a failure, it is replaced by the neighboring memory block. The memory block used for replacement is further replaced by its neighboring memory block, thereby enabling only one memory block including a failure to be repaired. Only one memory cell is selected in each memory block, and data of bits corresponding to the number of memory blocks can be simultaneously read/written.

FIG. 18 shows an example of the repairing method in the case where a defective bit is found in the memory block BLK6. In the diagram, broken lines indicate an inherent data input/output route in the case where there is no failure. Solid lines indicate a data input/output route in the case where the selector is switched for repairing the failure. The data input/output route is changed in such a manner that the redundancy decoder 118 decodes the repair address signals RYA0 to RYA5 input to the redundancy decoder 118 and generates a signal to switch the selector corresponding to the redundancy block R-BLK from the defective block. Table 5 shows an example of the relations between memory blocks including a defective bit and the repair address signals RYA0 to RYA5.

TABLE 5

| Defective memory | Repair address (RYA) | | | | | |
| --- | --- | --- | --- | --- | --- | --- |
| block | 0 | 1 | 2 | 3 | 4 | 5 |
| None | 0 | 0 | 0 | 0 | 0 | 0 |
| BLK0 | 0 | 0 | 0 | 0 | 0 | 1 |
| BLK1 | 0 | 0 | 0 | 0 | 1 | 0 |
| BLK2 | 0 | 0 | 0 | 0 | 1 | 1 |
| BLK3 | 0 | 0 | 0 | 1 | 0 | 0 |
| BLK4 | 0 | 0 | 0 | 1 | 0 | 1 |
| ... | | | ... | | | |
| BLK34 | 1 | 0 | 0 | 0 | 1 | 1 |
| BLK35 | 1 | 0 | 0 | 1 | 0 | 0 |

In order to replace a memory block having a defective bit found by the test of the RAM macro cell with the neighboring memory block, according to Table 5, a set of the ID (identification code) of the memory block having the defective bit and the repair address is set in the fuse set in the setting circuit shown in FIG. 3 and is transferred to the RAM macro cell, thereby automatically replacing the defective block by the redundancy circuit. For example, in the case where a defective bit is found in the memory block BLK4 in the macro cell of which type is "B" and of which macro cell number is "3", it is sufficient to set "0010011000101" in the set of 13 fuses shown in FIG. 3. It denotes that a fuse corresponding to a bit in which "1" is set is to be disconnected, and a fuse corresponding to a bit in which "0" is set is not disconnected. The head bit "0" indicates that the use is address repair. The following two bits "01" indicates that the type of the macro cell is "B", the following four bits "0011" denote that the macro cell number is "3", and the remaining six bits "000101" indicate that the defective block is the memory block BLK4.

Figure 19A:
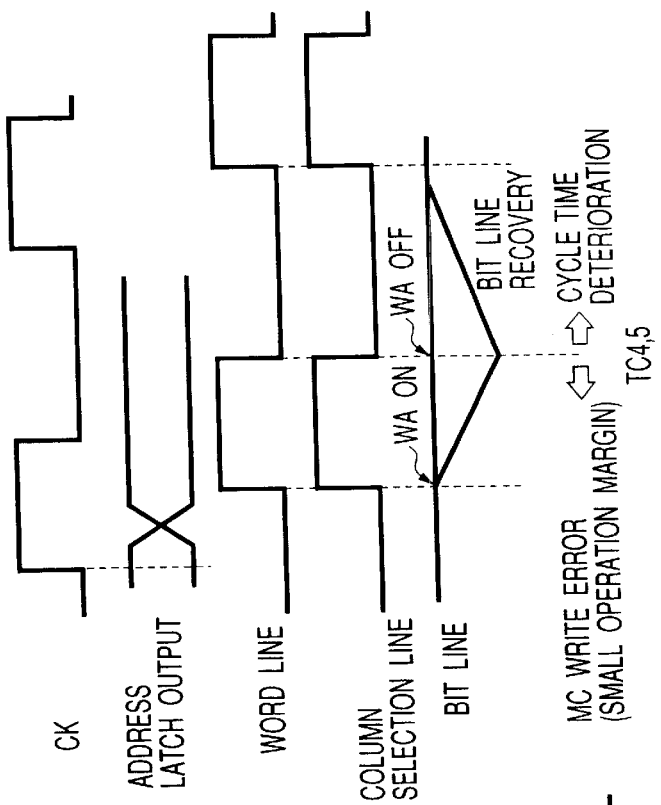
FIGS. 19A and 19B are a timing chart in a RAM core cell.

The adjustment of the timing in the RAM macro cell will now be described. In the RAM macro as shown in FIG. 16, as shown in FIG. 19A, when the word line WL is set to the selection level, the potential difference between the bit lines BL and /BL starts increasing. When the activate signal φsa is set to the high level at an appropriate timing to start the operation of the sense amplifier SA, the potential difference between the bit lines BL and /BL is amplified, and data of "0" or "1" is defined. In an actual device, due to device characteristic variations, an offset voltage or offset current occurs in the sense amplifier SA. When the sense amplifier SA is activated while the potential difference between the bit lines BL and /BL is small, that is, too soon after the word line is made active, there is the possibility that an erroneous operation such as amplification of the potential difference in the opposite direction occurs. On the other hand, when the margin is increased by delaying the timing of activating the sense amplifier SA to certainly avoid such erroneous operation, read time deteriorates.

It is therefore desirable to adjust the timing of activating the sense amplifier SA in accordance with the performances of each RAM macro cell. In the RAM macro cell of the embodiment, as stated above, such adjustment of the sense amplifier activating timing can be made by using the signals TC0 to TC3. Concretely, the adjustment is made as follows. For example, data for generating the proper adjustment signals TC0 to TC3 is input from the external data terminal DATA and is latched by the timing information receiving latch 122, and a test is conducted. By repeating the operation a plurality of times while shifting the timing, the optimum timing is detected. Data by which the optimum timing is obtained is set in the fuse set in FIG. 3 and is transferred to the RAM macro cell, thereby enabling the timing adjustment to be automatically made.

Figure 4:
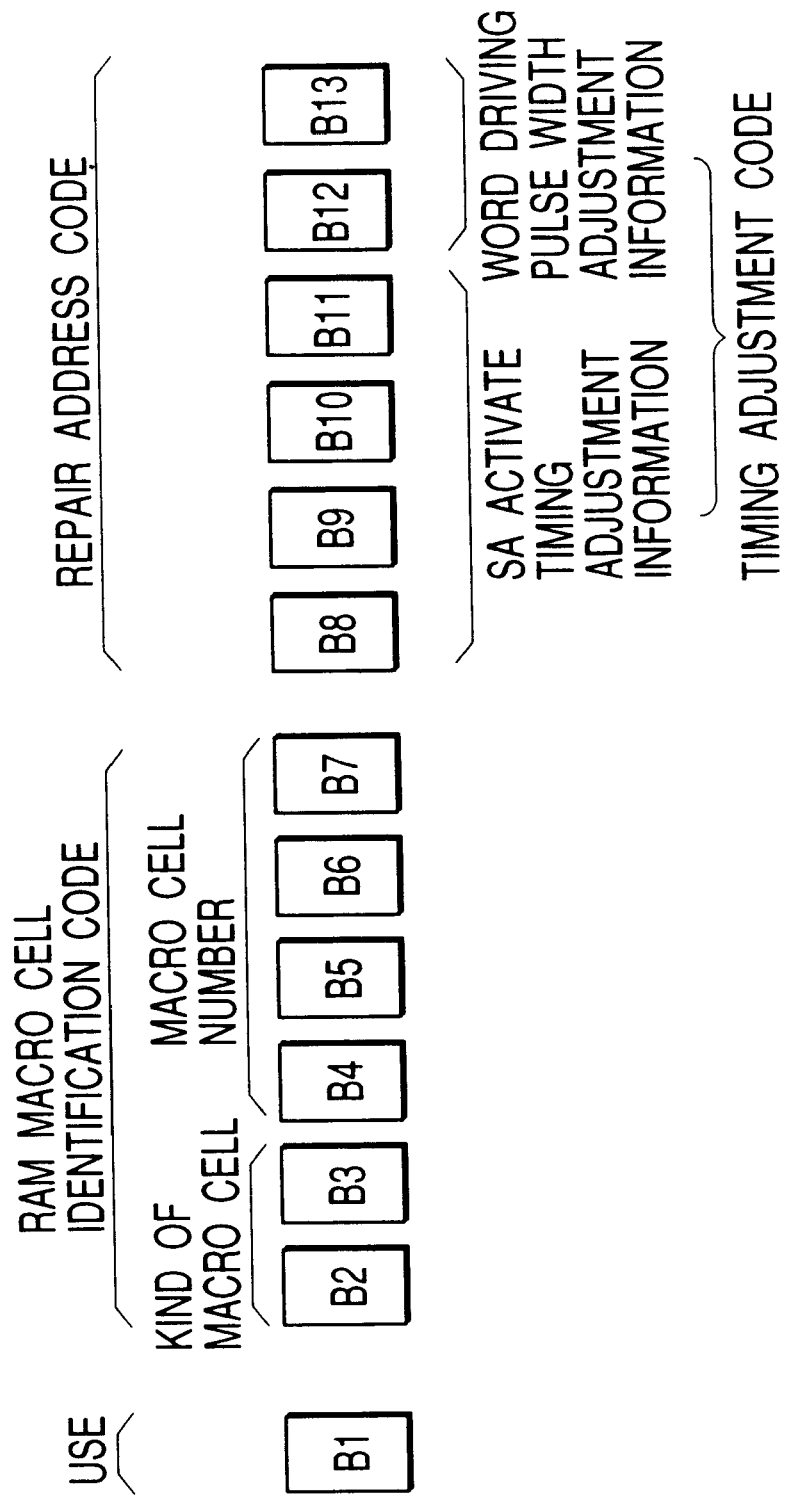
FIG. 4 is a diagram showing the configuration of a fuse set constructing the setting circuit.

In the case of such timing adjustment, when the types of the RAM macro cells are the same, characteristics are similar. Consequently, it is preferable to make the same setting for the macro cells of the same type. Specifically, by setting "1" to the bit B1 for use shown in FIG. 4 to designate timing adjustment, and a code indicative of the type of the macro cell to be adjusted is set in the bits B2 and B3 for designating the type of the macro cell. Further, desired timing information is set in the bits B8 to B11. In this case, by setting "1111" as the macro cell number in the bits B4 to B7, it can be declared that all macro cells are subjects to be adjusted.

In the embodiment, the repair address or timing information is set in the bits B8 to B13 and the bit B1 for designating the use designates either the repair address or timing information. Consequently, in a chip where a defective bit is replaced in even only one of the RAM macro cells of the same type, the timing adjustment cannot be made. In other words, by placing priority on the replacement of the defective bit, while assuring the yield, the capability of the RAM can be drawn out at the maximum. A RAM may be ranked according to its capability on the basis of the test result and the timing adjustment result and shipped.

Figure 19B:
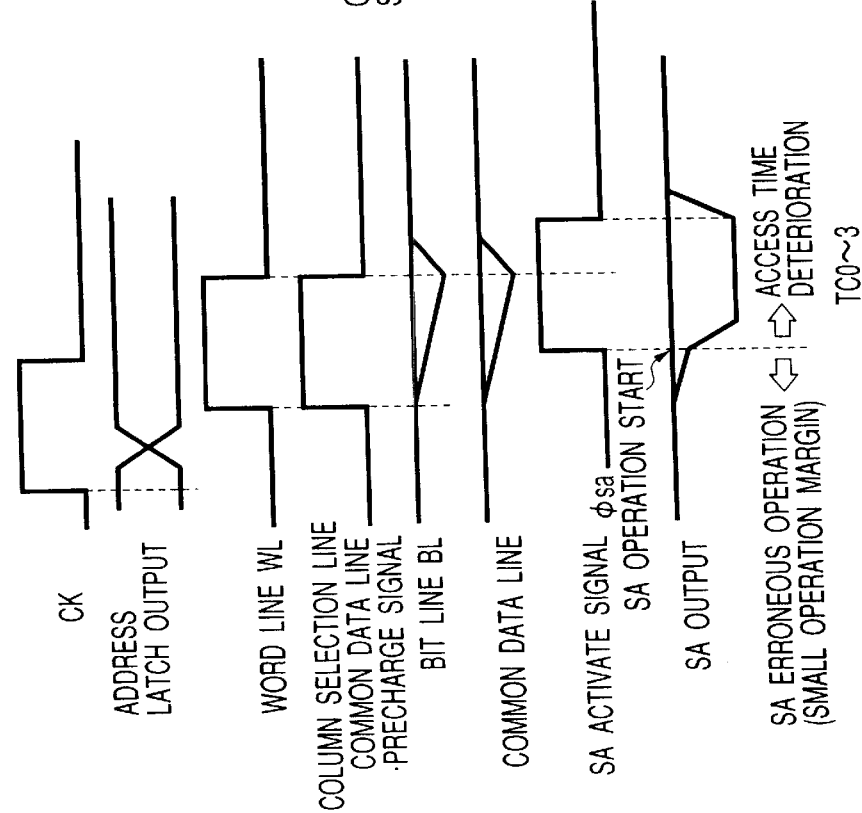

The adjustment of the write pulse width will now be described. The operation of writing data to the selected memory cell by the write amplifier WA has to be finished while the word line WL is at the selection level. As easily understood from FIG. 19B, assuming now that the write pulse width is short and the word line WL changes to a non-selection level before the data writing to the selected memory cell by the write amplifier WA is finished, in the case of inverting stored data, there is the possibility that a data input terminal of the selected memory cell is closed before the stored data is inverted, and writing is performed after that. On the contrarily, when the write pulse is set to be long to increase the margin too much, since the cycle time is determined by clocks, the time until the start of the next operation becomes short, time of precharging by the timing circuit 119 becomes short, the next operation starts before bit lines recover to a desired level, and it causes an erroneous operation. When the cycle of clocks is increased to avoid the erroneous operation and to make a cycle time long, the performance of the RAM deteriorates.

It is therefore desirable to adjust the write pulse width in accordance with the performances of each RAM macro cell. The RAM macro cell of the embodiment is constructed so that such adjustment of the write pulse width is performed by using the signals TC4 and TC5 as described above. As a concrete adjustment method is similar to the activate timing of the sense amplifier, its detailed description will not be repeated. In this case as well, when the type of the RAM macro cells is the same, characteristics are similar. It is therefore preferable to make the same setting for macro cells of the same type. In a chip where a defective bit is replaced in even only one of the RAM macro cells of the same type, the timing adjustment cannot be performed. In this case, it is preferable to place the priority on the replacement of the defective bit, thereby maximally drawing out the capability of the RAM while assuring the yield.

In the foregoing embodiment, the timing of activating the sense amplifier and the write pulse width have been explained as targets of timing adjustment. The timing of a signal in a memory to be adjusted is not limited to the above but, for example, the following timings can be also considered.

(1) a non-selection timing of a Y-axis selection signal of a column switch or the like
(2) an equalize start timing of a bit line, a sense amplifier, a data path at the post stage of the sense amplifier, and the like
(3) an equalize end timing of the bit line, sense amplifier, data path at the post stage of the sense amplifier, and the like
(4) set-up time and hold time of the input circuit IBF
(5) a latch timing of the output data latch DLT By making all or some of the above timings adjustable, the processing speed of the memory can be further increased by shortening the memory cell access time and the cycle time.

The method of evaluating the characteristics of the RAM macro cell and adjusting the timing in the LSI of the embodiment will now be described by referring to FIG. 20B.

In the characteristic evaluation and timing adjustment of the RAM macro cell, first, the trigger signal TRIG from the outside to the memory diagnosis controller 20 is negated to the low level (step S1). "011" is given as the mode signals TMODE0 to TMODE2 (step S2). By the signals, the memory diagnosis controller 20 recognizes the data input mode from the external terminal DATA and starts a corresponding control.

Subsequently, the control pulse PULSE is input from the outside to the memory diagnosis controller 20 (step S3). By the first control pulse PULSE, the memory diagnosis controller 20 is reset. Then the trigger signal TRIG is asserted to the high level (step S4). While applying the control pulse PULSE, the data DATA desired to be set in the RAM macro cell is input from the external data terminal (step S5). The memory diagnosis controller 20 captures data synchronously with the control pulse PULSE and converts the data into parallel data.

When the input data is captured, the memory diagnosis controller 20 transfers the data to the RAM macro cell via the memory control bus 30 (step S6). Since the data consists of 13 bits (refer to FIG. 4) and this case relates to the characteristic evaluation, "1" is set in the first bit B1 indicative of the use, and either "00", "01", or "10" indicative of the macro cell as a target is set in the bits B2 and B3 indicative of the type of the macro cell. Appropriate timing information is set in the bits B8 to B15.

After transferring the data, the memory diagnosis controller 20 waits time necessary for the RAM macro cell receiving latch to capture data on the bus and then captures the next data. The data capture and the data transfer are repeated only by the number equal to the number of data sets (three times in this case, since there are three types of macro cells), and the data transfer is finished. After that, the trigger signal TRIG from the outside is negated to the low level, and a series of data transfer processes is finished (step S7). FIG. 21 shows timings of major signals at the time of data input from the external terminal and the data transfer to the RAM macro cell. In the diagram, T1 denotes a reset period of the memory diagnosis controller 20, T2 denotes a period of capturing one set of data from the external terminal, T3 denotes a period of transferring one set of data to the RAM macro cell via the bus, T4 indicates a period of capturing one set of data by the receiving latch in the RAM macro cell, and T5 represents a repeating period.

Since the LSI of the embodiment has therein the memory test circuit (BIST), after completion of the data transfer, first, the test mode signals TMODE0 to TMODE2 are set to "111" as shown in FIG. 20C, and the start signal MBISTSTART is sent to the memory test circuit 40. In such a manner, the RAM macro cell test can be automatically conducted. On the basis of the result of the test, the characteristic evaluation and the determination of the defective bit are performed, and a repair address, an ID code or the type of the macro cell, and timing information to be set in the setting circuit 10 including the fuse set are generated.

In order to check whether the generated setting information is accurate or not, the generated setting information is transferred to the RAM macro cell, and a test according to FIG. 20C by the memory test circuit 40 is carried out again. To invalidate the data already set in the RAM macro cell receiving latch before transferring the setting information to the RAM macro cell, a latch resetting process according to FIG. 20D is performed. In the latch resetting process, first, the trigger signal TRIG from the outside to the memory diagnosis controller 20 is negated to the low level, and "001" is sent as the mode signals TMODE0 to TMODE2. By the operation, the memory diagnosis controller 20 recognizes the latch resetting mode and, in a period from the instance when the trigger signal TRIG is asserted to the high level until it is negated to the low level, produces an output "0" as transfer data onto the memory control bus 30 and "1" only as the signal (M16) for providing the latch trigger timing. The RAM macro cell captures the data all of which is "1" on the memory control bus 30 by the receiving latch, thereby finishing the resetting of the receiving latch.

After completion of the resetting of the receiving latch, processes of data input from the external terminal and data transfer according to FIG. 20B are performed. The RAM macro cell test is carried out again by the memory test circuit in accordance with FIG. 20C. When the generated fuse setting information is determined correct, a process of setting the setting information in each of the fuses of the setting circuit 10 is performed.

After that, the transfer of the fuse setting information of the setting circuit 10 is performed according to FIG. 20E. In the setting information transferring process, first, the trigger signal TRIG from the outside to the memory diagnosis controller 20 is negated to the low level, and "010" is supplied as the mode signals TMODE0 to TMODE2. By the signals, the memory diagnosis controller 20 recognizes a fuse setting information transfer mode. In a period from the instance when the trigger signal TRIG is asserted to the high level until it is negated to the low level, the memory diagnosis controller 20 automatically performs a process of reading the setting information in series from the setting circuit 10, converting the setting information to parallel data, and transferring the parallel data to the RAM macro cell via the memory control bus 30. The RAM macro cell captures the data on the memory control bus 30 by the receiving latch, thereby finishing the transfer of the fuse setting information to the receiving latch. The data transfer at this time is performed according to the clock signal CK supplied from the outside.

To check whether the setting information set is accurate or not, a test according to FIG. 20C is conducted again by the memory test circuit 40, and debugging of the RAM macro cell is finished. In the LSI of the embodiment having the fuse setting circuit and the memory diagnosis controller, by using the mechanism of FIG. 20B, in the case where a failure occurs after the chip is mounted on the system board, the failure can be repaired and the performance can be optimized on the board. To be specific, by mounting a flash memory or the like on the system board and storing the same information as the information set in the fuse setting circuit in the chip into the flash memory. When a failure is found in the test according to FIG. 20C, information capable of avoiding the failure is generated, and the data in the flash memory is rewritten on the basis of the information.

The transfer of the fuse setting information from the setting circuit 10 to the RAM macro cell is performed also at start-up of the system. FIG. 20A shows the data transfer procedure at the start-up of the system.

At the start-up of the system, first, "000" is set as the mode signals TMODE0 to TMODE2 supplied from the outside to the memory diagnosis controller 20 (step S31). By the operation, the memory diagnosis controller 20 recognizes that the transfer of the fuse setting information from the setting circuit 10 to the RAM macro cell is necessary.

After waiting about 1 µ/sec until the system clock becomes stable (step S32), in response to assertion of the trigger signal TRIG to the high level, the process of starting the transfer of the setting information (steps S33 and S34), serially reading the setting information from the setting circuit 10, converting the setting information to parallel data, and transferring the parallel data to the RAM macro cell via the memory control bus 30 is performed. The RAM macro cell latches the data on the memory control bus 30 by the receiving latch, thereby finishing the transfer of the fuse setting information to the receiving latch (step S35). After that, the trigger signal TRIG is negated to the low level (step S36), and the inherent operation of the system is started (step S37).

Another embodiment of the invention will be described by referring to FIGS. 22 and 23.

Figure 22:
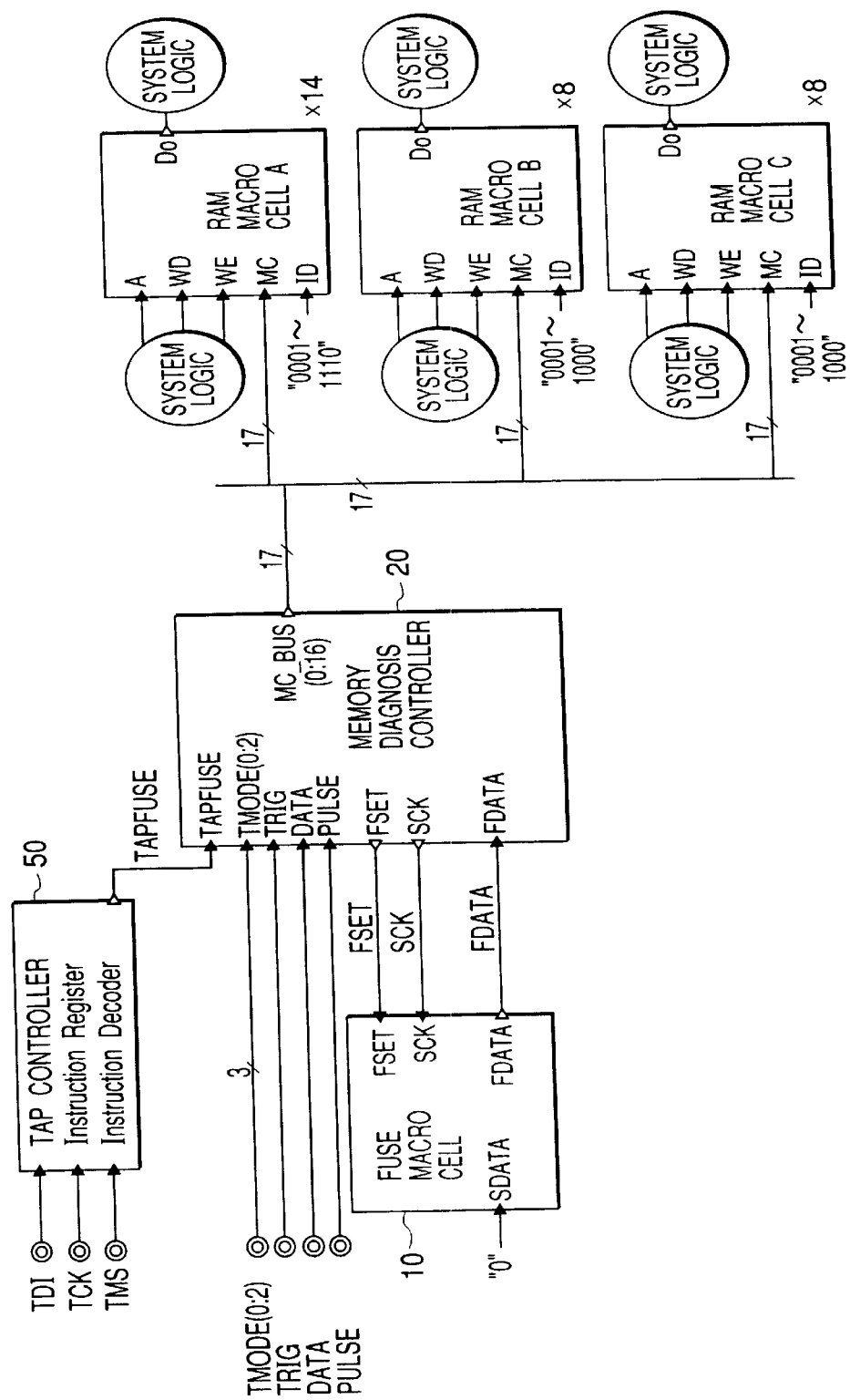
FIG. 22 is a diagram showing a schematic configuration of a semiconductor integrated circuit provided with a TAP controller.

In the embodiment of FIG. 22, in place of the memory test circuit 40 using the BIST in the first embodiment (refer to FIG. 2), a TAP (Test Access Port) controller 50 specified by the JTAG (Joint Test Action Group) is provided. The configurations of the memory diagnosis controller 20 and the fuse setting circuit 10 are similar to those in the foregoing embodiment.

In the another embodiment, an automatic transfer instruction of the fuse setting circuit is prepared as one of instructions of the JTAG. When the status of the TAP controller 50 is changed from "Updata-IR" to "Run-test/Idle", a control signal TAPFUSE from the TAP controller 50 to the memory diagnosis controller 20 is asserted. When the control signal TAPFUSE is asserted, the memory diagnosis controller 20 automatically transfers the information set in the fuse setting circuit 10. It is also possible to define other modes such as test of the RAM macro cell, transfer of data from the external terminal to the RAM macro cell, and resetting of the receiving latch in the RAM macro cell as optional instructions of the JTAG and execute the instructions.

Figure 23:
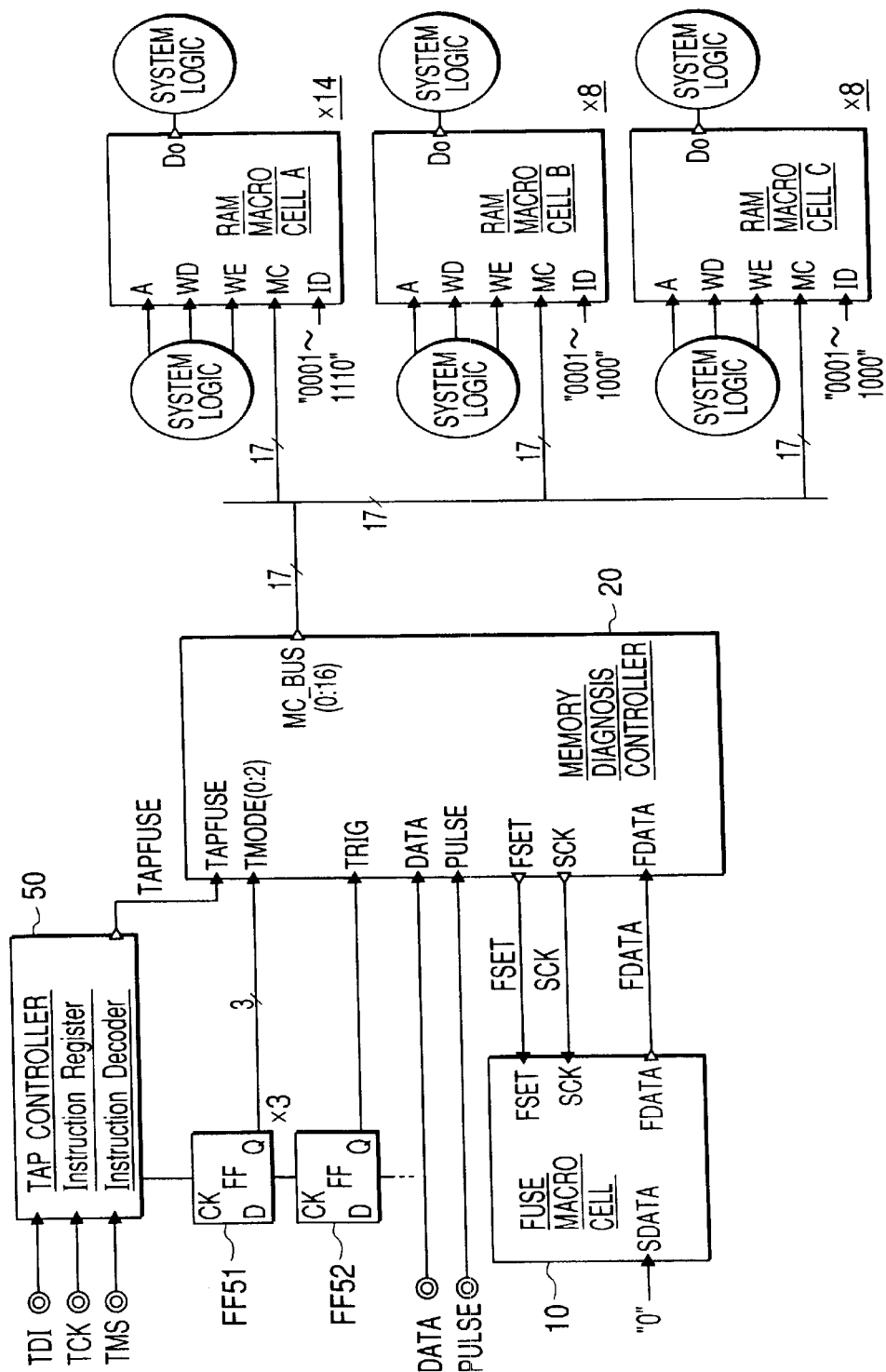
FIG. 23 is a diagram showing a schematic configuration of a semiconductor integrated circuit further provided with a flip flop circuit.

According to the embodiment of FIG. 23, in place of providing the external terminal for inputting the test mode signals TMODE0 to TMODE2 and the trigger signal TRIG in FIG. 22, the signals are supplied from flip flops FF51 and FF52. Desirably, by providing the flip flops FF51 and FF52 on a test scan path in the internal logic circuit or on a scan path for the boundary-scan test, setting is made via the scan path. By providing the flip flops FF51 and FF52 on the scan path for boundary-scan test, setting on the system board and a test of the RAM macro cell by the setting can be also achieved.

Although the defective repair in the RAM macro cell and the adjustment of the read/write timings have been described as an example in the foregoing embodiment, the invention can be also applied to adjustment of performances of the circuit blocks other than the RAM macro cell and setting of the operation modes such as setting of multiplication ratio of a PLL circuit and adjustment of the timing of a transmission clock in a clock amplifier.

As one of modifications, an example where the invention is applied to a clock amplifier will be described by referring to FIGS. 24 and 25.

Figure 24:
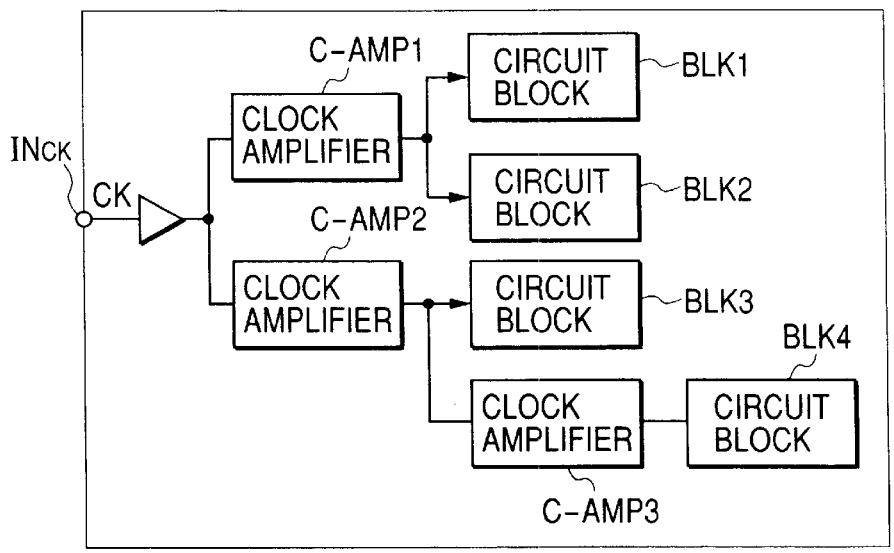
FIG. 24 is a schematic configuration diagram showing a clock distributing system for distributing a clock signal supplied from the outside to a circuit block provided in the chip.

FIG. 24 shows a simplified clock distributing system for distributing a clock signal CK supplied from the outside to macro cells such as a RAM and an arithmetic unit provided on the inside of the chip. In a large-scaled logic LSI, the distance from an external terminal INck to which the clock signal CK is input to each of circuit blocks BLK1, BLK2, ... at the ends such as macro cells to which clocks are supplied from the external terminal INck is relatively long, and the length of clock supply paths varies according to the blocks. Consequently, there is a case that a clock skew occurs. Due to the clock skew, a signal latch timing may be deviated, and there is the possibility that an erroneous operation occurs. In the large-scaled logic LSI having the circuit blocks operating synchronously with clocks, therefore, buffers C-AMP1, C-AMP2, ... called clock amplifiers may be provided in some midpoint of the clock supply paths.

Figure 25:
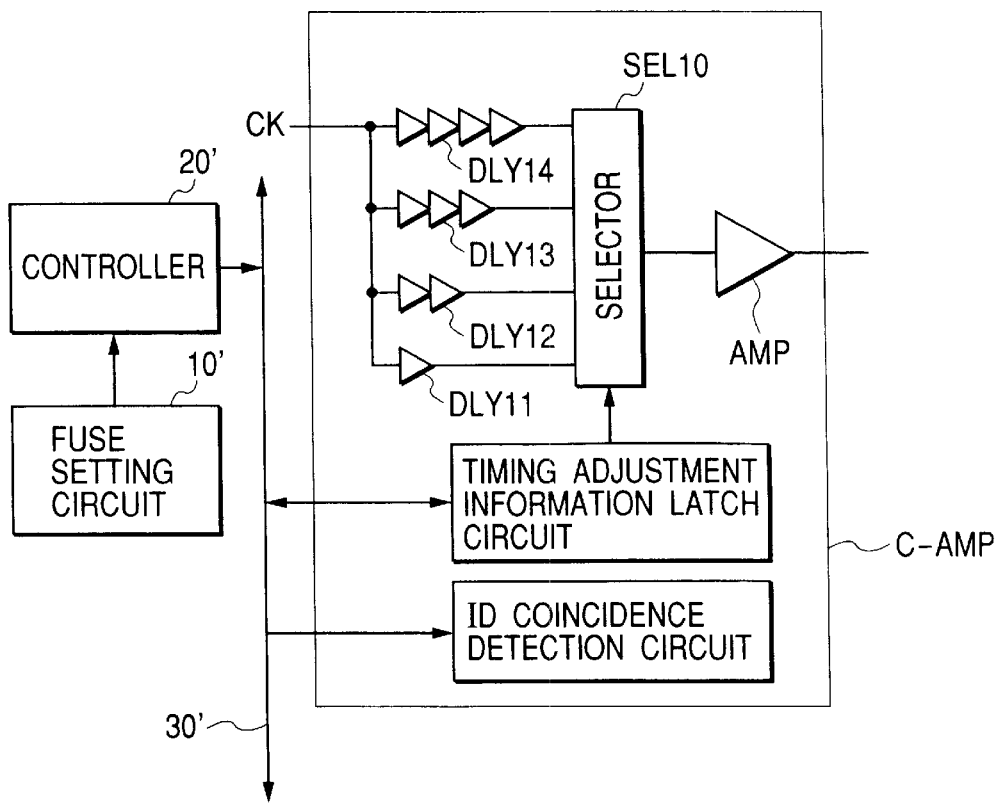
FIG. 25 is a block diagram showing an embodiment in the case where the invention is applied to a clock amplifier.

FIG. 25 schematically shows an embodiment of the case where the invention is applied to a clock amplifier to prevent such a clock skew. The clock amplifier C-AMP of the embodiment includes, at the ante-stage of the inherent buffer amplifier AMP, a plurality of delay circuits DLY11, DLY12, DLY13, DLY14, ... having different delay times to adjust the timing of the input clock CK, a selector SEL10 to select a clock passed through any of the delay circuits, a timing information latch circuit LAT10 for holding switch control information of the selector SEL10 transferred from a fuse setting circuit 10' to the clock amplifier C-AMP via a memory control bus 30' under the control of a controller 20', and an ID coincidence detecting circuit CMP1O for detecting whether or not an ID (identification code) transferred from the fuse setting circuit 10' to the clock amplifier C-AMP coincides with an ID preliminarily given.

The fuse setting circuit 10' and the controller 20' have configurations similar to those of the fuse setting circuit 10 and the controller 20 provided in correspondence with the RAM macro cells in the foregoing embodiment, respectively. In a manner similar to that described in the foregoing embodiment, selector switching control information and ID (identification code) are transferred from the fuse setting circuit 10' to the clock amplifier C-AMP. When the ID coincidence detecting circuit CMP10 detects that the ID (identification code) transferred and the self ID coincide with each other, the clock amplifier C-AMP latches selector switching control information of the memory control bus 30' at that time by the latch LAT10. In such a manner, the clock in the clock amplifier C-AMP can be adjusted to an optimum timing and outputted.

Although the invention achieved by the present inventors has been described concretely on the basis of the embodiments, the invention is not limited to the foregoing embodiments but, obviously, can be variously modified within the range not departing from the gist. For example, in place of the fuse device in the setting circuit for adjusting the repair address, the activate timing of the sense amplifier, and the like, the same device as a nonvolatile memory device constructing a flash memory may be used.

The case in which the invention achieved by the present inventors is applied to an LSI such as a microprocessor having therein a plurality of RAMs in the utilization field as a background of the invention has been described above. However, the invention is not limited to the case but can be generally used for a semiconductor integrated circuit in which performance adjustment or operation mode of the internal circuit are desired to be set after manufacture.

Effects obtained by representative ones of the inventions disclosed in the application will be briefly described as follows.

After manufacture, setting such as timing adjustment can be changed on a circuit block basis in a semiconductor integrated circuit, thereby enabling the performance of each circuit block to be maximally drawn out and the yield to be improved. For example, in a semiconductor integrated circuit having therein a plurality of memory circuits, by adjusting the timing of accessing the memory circuits, the operation margin is increased and the memory circuits can be accessed at higher speed. In a semiconductor integrated circuit having therein a plurality of memory circuits, a defective bit in a memory circuit is repaired efficiently, thereby enabling the yield to be improved.

What is claimed is:

1. A semiconductor integrated circuit device, comprising:
    a plurality of circuit blocks each including:
        a timing adjusting circuit which adjusts a timing of a signal which gives an operation timing of the circuit block,
        a detecting circuit which determines whether a first identification code to be inputted matches with a second identification code,
        a circuit which stores the second identification code, and
        a latch;
    a programmable circuit capable of programming the first identification code and timing information corresponding to the first identification code and serially outputting the timing information; and
    a control circuit which sequentially reads the timing information from the programmable circuit, converts the read timing information into parallel data, and transfers the parallel data to the plurality of circuit blocks,
    wherein each of the plurality of circuit blocks holds the timing information by the latch when the detecting circuit determines that the first identification code and the second identification code match with each other, and
    wherein an operation of the timing adjusting circuit is controlled in accordance with the timing information held in the latch.

2. A semiconductor integrated circuit device according to claim 1,
    wherein the timing information is transferred to the plurality of circuit blocks via a bus having a plurality of signal lines.

3. A semiconductor integrated circuit device according to claim 1,
    wherein the programmable circuit has:
        a plurality of program elements which can be programmed from outside the semiconductor integrated circuit, and
        a shift register which reads states of the program elements in parallel and serially transfers the read states.

4. A semiconductor integrated circuit device according to claim 3,
    wherein the shift register performs a shifting operation in accordance with a shift clock signal supplied from the control circuit.

5. A semiconductor integrated circuit device according to claim 1, further comprising:
    an external terminal to which externally inputted timing information is inputted from outside the semiconductor integrated circuit,
    wherein the control circuit selectively transfers one of the externally inputted timing information and the timing information in the programmable circuit to the latch in each of the plurality of circuit blocks.

6. A semiconductor integrated circuit device according to claim 1, further comprising:
    a test control circuit which operates the plurality of circuit blocks for a test,
    wherein each of the plurality of circuit blocks operates in response to a control signal from the test control circuit and outputs a test operation result.

* * * * *